US012652909B2

(12) United States Patent
Yuan et al.

(10) Patent No.: US 12,652,909 B2
(45) Date of Patent: Jun. 9, 2026

(54) DISPLAY SUBSTRATE AND DISPLAY DEVICE

(71) Applicants: Hefei BOE Joint Technology Co., Ltd., Hefei (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN); Jun Liu, Beijing (CN)

(73) Assignees: Hefei BOE Joint Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 701 days.

(21) Appl. No.: 17/926,747

(22) PCT Filed: Nov. 29, 2021

(86) PCT No.: PCT/CN2021/134167
§ 371 (c)(1),
(2) Date: Nov. 21, 2022

(87) PCT Pub. No.: WO2023/092607
PCT Pub. Date: Jun. 1, 2023

(65) Prior Publication Data
US 2024/0138211 A1      Apr. 25, 2024

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *G09G 3/3233* (2013.01); *G09G 3/3241* (2013.01)

(58) Field of Classification Search
CPC .. H10K 59/131; H10K 59/1315; H10K 59/90; H10K 59/95; H10K 50/00;
(Continued)

(56) References Cited

U.S. PATENT DOCUMENTS

2009/0140253 A1    6/2009  Kashahara
2018/0330663 A1    11/2018  Yang et al.
(Continued)

FOREIGN PATENT DOCUMENTS

CN      111816123 A    10/2020
CN      112909065 A    6/2021
(Continued)

*Primary Examiner* — Dale E Page
*Assistant Examiner* — Douglas Yap
(74) *Attorney, Agent, or Firm* — MUNCY, GEISSLER, OLDS & LOWE, P.C.

(57) ABSTRACT

A display substrate and a display device are provided. The display substrate includes: a base substrate and a plurality of sub-pixels arranged on the base substrate, the plurality of the sub-pixels are arranged in an array, the sub-pixel includes: a reference signal line and a second scan line; and a sub-pixel driving circuit including a driving transistor and a second transistor, a gate electrode of the second transistor is coupled to the second scan line, a first electrode of the second transistor and the reference signal line form an integrated structure, a second electrode of the second transistor is coupled to a gate electrode of the driving transistor.

18 Claims, 24 Drawing Sheets

(51) Int. Cl.
    *G09G 3/3233*     (2016.01)
    *G09G 3/3241*     (2016.01)

(58) Field of Classification Search
CPC .... H10K 59/00; H10K 59/12; H10K 59/1201; H10K 59/1213; H10K 59/1216; H10K 59/124; H10K 59/35; H10K 59/84; H10K 59/88; H10K 71/00; H10K 71/861; G09G 3/3225; G09G 3/3233; G09G 3/3241; G09G 2230/00; G09G 2230/0417; G09G 2230/0426; G09G 2230/043; G09G 2230/0809; G09G 2230/0819; G09G 2230/0852; G09G 2230/0861; G09G 2230/0866; G09G 2310/0251; G09G 2310/0254; G09G 2310/0262; G09G 2310/0264; G09G 2310/027; G09G 2310/0289; G09G 2310/061; G09G 2310/08; G09G 2320/0214; G09G 2320/0223; G09G 2320/0233; G09G 2320/0247; G09G 2320/0276; G09G 2320/0295; G09G 2320/043; G09G 2320/045; G09G 2330/02; G09G 2330/021; G09G 2330/08; G09G 2360/148; G09G 2360/18; G09G 3/006; G09G 3/20; G09G 3/2011; G09G 3/2014; G09G 3/2022; G09G 3/2077; G09G 3/2081; G09G 3/30; G09G 3/32; G09G 3/3208; G09G 3/3258; G09G 3/3266; G09G 3/3283; G09G 3/3291; G09G 3/3655; G09G 5/02; H10D 30/67–6759; H10D 1/47; H10D 18/251; H10D 30/00; H10D 30/021; H10D 30/024; H10D 30/0287; H10D 30/47; H10D 30/60; H10D 30/611; H10D 30/62; H10D 30/6215; H10D 30/6219; H10D 30/655; H10D 30/663; H10D 30/668; H10D 30/669; H10D 30/6728; H10D 30/6739; H10D 30/6744; H10D 30/6757; H10D 30/83; H10D 62/10; H10D 62/124; H10D 62/127; H10D 62/393; H10D 62/83; H10D 62/8503; H10D 64/112; H10D 64/118; H10D 64/256; H10D 64/512; H10D 8/00; H10D 8/80; H10D 84/00; H10D 84/0186; H10D 84/0193; H10D 84/038; H10D 84/135; H10D 84/141; H10D 84/401; H10D 84/403; H10D 84/641; H10D 84/811; H10D 84/85; H10D 84/853; H10D 84/854; H10D 84/907; H10D 84/975; H10D 84/981; H10D 84/988; H10D 86/01; H10D 86/011; H10D 86/201; H10D 86/215; H10D 86/421; H10D 86/451; H10D 86/481; H10D 86/60; H10D 89/00; H10D 89/10; H10D 89/60; H10D 89/601; H10D 89/611; H10D 89/711; H10D 89/713; H10D 89/811; H10D 89/814; H10D 89/819; H10D 89/911; G06V 40/1306; G06V 40/1318; G06V 40/1329; H01L 21/4846; H01L 21/765; H01L 21/76807; H01L 21/76838; H01L 22/00; H01L 2224/023; H01L 2224/05554; H01L 2224/0603; H01L 2224/32145; H01L 2224/45014; H01L 2224/48091; H01L 2224/48096; H01L 2224/48137; H01L 2224/48139; H01L 2224/48145; H01L 2224/48227; H01L 2224/48247; H01L 2224/48472; H01L 2224/4903; H01L 2224/49111; H01L 2224/49175; H01L 2224/83825; H01L 2224/8384; H01L 2224/8385; H01L 23/13; H01L 23/34; H01L 23/345; H01L 23/3675; H01L 23/4825; H01L 23/495; H01L 23/49575; H01L 23/49805; H01L 23/49838; H01L 23/5226; H01L 23/5227; H01L 23/528; H01L 23/5286; H01L 23/53209; H01L 23/53228; H01L 23/53242; H01L 23/57; H01L 23/64; H01L 24/45; H01L 24/58; H01L 24/49; H01L 24/83; H01L 25/072; H01L 25/16; H01L 2924/00014; H01L 2924/0002; H01L 2924/01005; H01L 2924/01006; H01L 2924/01014; H01L 2924/01027; H01L 2924/01029; H01L 2924/01033; H01L 2924/01047; H01L 2924/0105; H01L 2924/01068; H01L 2924/014; H01L 2924/10253; H01L 2924/1301; H01L 2924/1305; H01L 2924/13055; H01L 2924/13062; H01L 2924/13091; H01L 2924/14; H01L 2924/1461; H01L 2924/181; H01L 2924/19042; H01L 2924/19043; H01L 2924/19104; H01L 2924/3011; H02J 1/02; H02J 1/08; H02J 1/082; H02J 1/102; H02J 1/12; H02J 13/00002; H02J 2300/24; H02J 2300/26; H02J 2310/46; H02J 3/381; H02J 3/40; H02J 3/466; H02J 50/12; H02J 7/0013; H02J 7/0014; H02J 7/0016; H02J 7/0018; H02J 7/0019; H02J 7/0025; H02J 7/00302; H02J 7/00306; H02J 7/00309; H02J 7/0047; H02J 7/0048; H02J 7/005; H02J 9/005; H02J 9/006

See application file for complete search history.

(56) References Cited

U.S. PATENT DOCUMENTS

| | | | | |
|---|---|---|---|---|
| 2020/0410909 A1* | 12/2020 | Jung | | H10K 59/873 |
| 2021/0313415 A1* | 10/2021 | Ma | | H10K 59/131 |
| 2021/0335234 A1* | 10/2021 | Yin | | G09G 3/3291 |
| 2021/0359075 A1 | 11/2021 | Liu et al. | | |
| 2022/0180816 A1 | 6/2022 | Yuan et al. | | |
| 2022/0328611 A1 | 10/2022 | Lu et al. | | |

FOREIGN PATENT DOCUMENTS

| | | |
|---|---|---|
| CN | 113348558 A | 9/2021 |
| CN | 113437232 A | 9/2021 |
| JP | 2011013485 A | 1/2011 |
| JP | 2019525209 A | 9/2019 |
| KR | 20210076761 A | 6/2021 |
| KR | 20210080781 A | 7/2021 |

* cited by examiner

70 second direction first direction

81 second direction first direction

DISPLAY SUBSTRATE AND DISPLAY DEVICE

CROSS-REFERENCE TO RELATED APPLICATION

This application is the U.S. national phase of PCT Application No. PCT/CN2021/134167 filed on Nov. 29, 2021, which is incorporated herein by reference in its entirety.

TECHNICAL FIELD

The present disclosure relates to the field of display technology, in particular to a display substrate and a display device.

BACKGROUND

Organic Light-Emitting Diode (OLED) display products excites a spectrum of various wavelengths through the combination of electrons and holes, thereby forming an image. OLED display products have the advantages of fast response speed and maximum contrast, and become the next generation of main display product.

OLED display products include: display panels, gate driving devices, data drivers and timing controllers. The display panel includes: data lines, gate lines, and pixels. The usual mode of operation is that the gate driving device provides a gate driving signal to the gate line, and when the gate driving signal is provided to the gate line, the data voltage transmitted by the data line is written into the corresponding row of pixels. The pixels emit light of different brightness according to the size of the data voltage to realize the display function.

SUMMARY

An object of the present disclosure is to provide a display substrate and a display device.

In order to achieve the above-mentioned object, the present disclosure provides the following technical solutions.

In one aspect, the present disclosure provides in some embodiments a display substrate, including: a base substrate and a plurality of sub-pixels arranged on the base substrate; the plurality of sub-pixels is arranged in an array; the sub-pixel includes: a reference signal line and a second scan line; and, a sub-pixel driving circuit including a driving transistor and a second transistor, a gate electrode of the second transistor being coupled to the second scan line, a first electrode of the second transistor and the reference signal line forming an integrated structure, a second electrode of the second transistor being coupled to a gate electrode of the driving transistor.

Optionally, the second transistor includes a second active layer, the second active layer forms the first electrode and second electrode of the second transistor, and at least part of the reference signal line extends along a first direction; at least part of the second active layer extends along the first direction; at least part of the second scan line extends along the first direction; at least part of an orthographic projection of the second active layer on the base substrate is located between an orthographic projection of the reference signal line on the base substrate and an orthographic projection of the second scan line on the base substrate.

Optionally, the sub-pixel further includes a first scan line, a data line, and a first connection pattern; the sub-pixel driving circuit further includes a first transistor; a gate electrode of the first transistor is coupled to the first scan line, a first electrode of the first transistor is coupled to the data line, and a second electrode of the first transistor is coupled to the gate electrode of the driving transistor; the first connection pattern is respectively coupled to the second electrode of the first transistor and the second electrode of the second transistor, an orthographic projection of the first connection pattern on the base substrate overlaps an orthographic projection of the first scan line on the base substrate and an orthographic projection of the second scan line on the base substrate, respectively.

Optionally, the plurality of sub-pixels is divided into a plurality of repeating units, and the plurality of repeating units is divided into a plurality of columns of repeating units; the display substrate further includes a plurality of power lines, and the plurality of power lines and the plurality of columns of repeating units are alternately arranged along the first direction; in each repeating unit, reference signal lines located in sub-pixels of a same row along the first direction form an integrated structure; an orthographic projection of the reference signal line on the base substrate does not overlap an orthographic projection of the power line on the base substrate.

Optionally, the sub-pixel further includes a third scan line and an initialization signal line; the sub-pixel driving circuit further includes a third transistor, a gate electrode of the third transistor is coupled to the third scan line, a first electrode of the third transistor and the initialization signal line form an integrated structure, and a second electrode of the third transistor is coupled to a first electrode of the driving transistor.

Optionally, in each repeating unit, initialization signal lines located in the sub-pixels of the same row along the first direction form an integrated structure; an orthographic projection of the initialization signal line on the base substrate does not overlap the orthographic projection of the power line on the base substrate.

Optionally, the repeating unit includes an initialization signal bus, at least part of the initialization signal bus extends along a second direction, and the second direction intersects the first direction; the initialization signal bus is coupled to the initialization signal line.

Optionally, the third transistor is of a double gate structure, the third transistor includes a third active layer, the third active layer includes two third channel portions, and a conductor portion respectively coupled to the two third channel portions; the repeating unit includes a plurality of second connection patterns, in the repeating unit, along the first direction, first electrodes of adjacent third transistors are coupled through the second connection pattern, or conductor portions of the adjacent third transistors are coupled through the second connection pattern; an orthographic projection of the second connection pattern on the base substrate is located between orthographic projections of part of gate electrodes of two adjacent third transistors coupled to the second connection pattern on the base substrate; the repeating unit further includes an initialization signal bus, the initialization signal bus extends along a second direction, the second direction intersects the first direction, and the initialization signal bus is coupled to the second connection pattern.

Optionally, the first electrode or the conductor portion of the third transistor coupled to the second connection pattern and the second connection pattern form an integrated structure.

Optionally, the third active layer is of a U-shaped structure, and there are two overlapping areas between an orthographic projection of the third active layer on the base substrate and an orthographic projection of the third scan line on the base substrate; two ends of the third active layer at the U-shaped opening are respectively coupled to the initialization signal line; a part of the third active layer at a bottom of the U-shape is coupled to the first electrode of the driving transistor.

Optionally, the sub-pixel further includes a light-emitting control line; the sub-pixel driving circuit further includes a fourth transistor, a gate electrode of the fourth transistor is coupled to the light-emitting control line, the a electrode of the fourth transistor is coupled to the power line, and a second electrode of the fourth transistor is coupled to a second electrode of the driving transistor; in a same repeating unit, a same fourth transistor is shared by adjacent sub-pixel driving circuits along the second direction, and the same light-emitting control signal line is shared by the adjacent sub-pixel driving circuits along the second direction.

Optionally, the sub-pixel includes an anode pattern; the fourth transistor includes a fourth active layer, an orthographic projection of the fourth active layer on the base substrate is located between orthographic projections of two adjacent anode patterns along the second direction on the base substrate.

Optionally, the driving transistor includes a driving active layer; among two adjacent subpixels along the first direction, two driving active layers included in two driving transistors are symmetrically arranged about a first symmetry axis, the first symmetry axis extends along the second direction, and an orthographic projection of the first symmetry axis on the base substrate is located between orthographic projections of two anode patterns included in the two adjacent subpixels along the first direction on the base substrate; among two adjacent sub-pixels along the second direction, two driving active layers included in two driving transistors are symmetrically arranged about a second symmetry axis, the second symmetry axis extends along the first direction, an orthographic projection of the second symmetry axis on the base substrate is located between orthographic projections of two anode patterns included in the two adjacent sub-pixels along the second direction on the base substrate.

Optionally, the second transistor includes a second active layer; among two adjacent sub-pixels along the first direction, two second active layers included in two second transistors are arranged symmetrically about the first symmetry axis; among two adjacent sub-pixels along the second direction, two second active layers included in two second transistors are arranged symmetrically about the second symmetry axis.

Optionally, the sub-pixel driving circuit further includes a first transistor, the first transistor includes a first active layer; among two adjacent sub-pixels along the first direction, two first active layers included in two first transistors is symmetrically arranged about the first symmetry axis; among two adjacent sub-pixels along the second direction, two first active layers included in two first transistors are symmetrically arranged about the second symmetry axis.

Optionally, the sub-pixel driving circuit further includes a third transistor, the third transistor includes a third active layer; among two adjacent subpixels along the first direction, two third active layers included in two third transistors are symmetrically arranged about the first symmetry axis; among two adjacent sub-pixels along the second direction, two third active layers included in two third transistors are symmetrically arranged about the second symmetry axis.

Optionally, the sub-pixel driving circuit also includes a fourth transistor, the fourth transistor includes a fourth active layer; among two adjacent sub-pixels along the first direction, two fourth active layers included in two fourth transistors are symmetrically arranged about the first symmetry axis.

In a second aspect, an embodiment of the present disclosure provides a display device including the display substrate.

BRIEF DESCRIPTION OF THE DRAWINGS

The drawings described herein are used to provide a further understanding of the disclosure and constitute a part of the disclosure. The schematic embodiments and their descriptions of the disclosure are used to explain the disclosure, and do not constitute an improper limitation of the disclosure. In the attached drawing.

DETAILED DESCRIPTION

Figure 1:
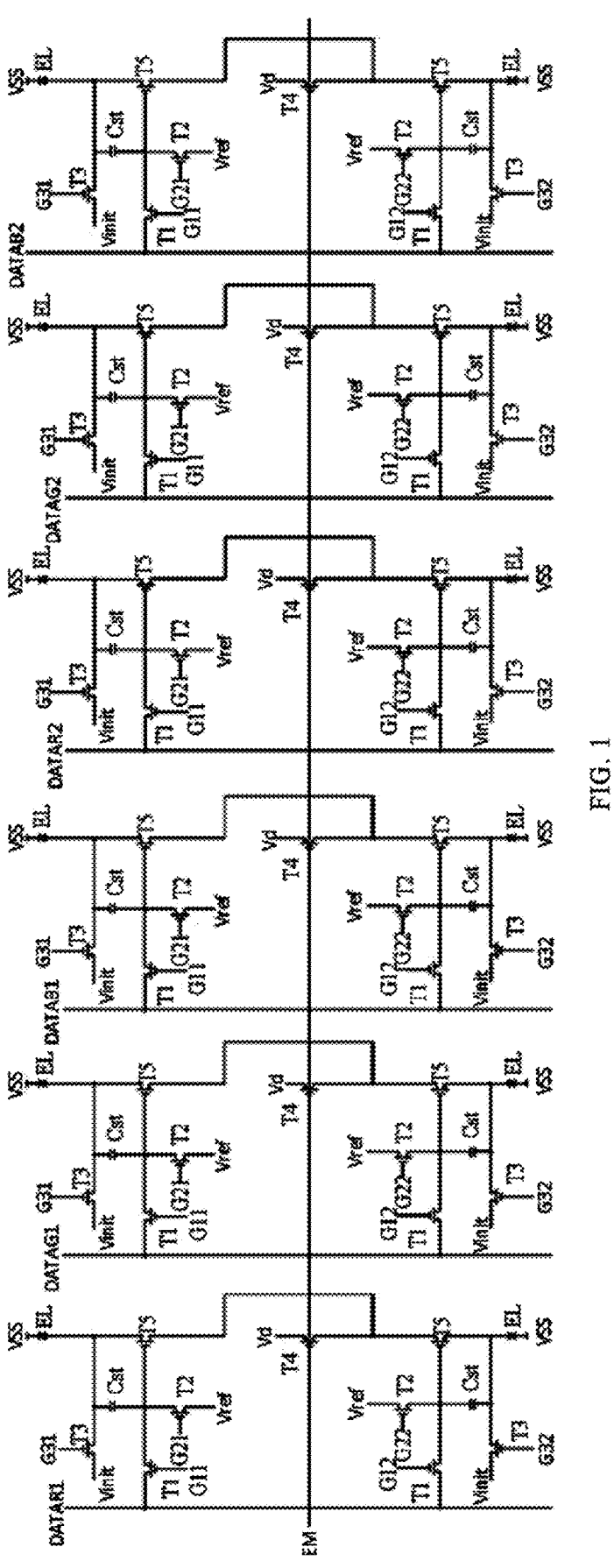
FIG. 1 is a circuit diagram corresponding to the smallest repeating unit in the display substrate provided by the embodiment of the present disclosure.

In order to further explain the display substrate and display device provided by the embodiments of the present disclosure, the following will be described in detail with reference to the drawings of the disclosure.

With the continuous development of display technology, people's requirements for display quality of display products are constantly improving. In order to achieve high-quality display, high-resolution display products are attracting more and more attention. However, the layout space of display products is limited, and high resolution will increase the layout difficulty of subpixel, which is not conducive to the production yield of display products.

As shown in FIG. 3, FIG. 4, FIG. 5, FIG. 10, FIG. 11, and FIGS. 14-28, the embodiment of the present disclosure provides a display substrate, including: a base substrate, a plurality of sub-pixels arranged on the base substrate, and the plurality of sub-pixels are arranged in an array; the sub-pixel includes:

a reference signal line 36 and a second scan line 42; and, a sub-pixel driving circuit including a driving transistor T5 and a second transistor T2. A gate electrode of the second transistor T2 is coupled to the second scan line 42. A first electrode of the second transistor T2 and the reference signal line 36 form an integrated structure. A second electrode of the second transistor T2 is coupled to the gate electrode of the driving transistor T5.

Exemplary, the display substrate includes a display area and a peripheral area surrounding the display area. The display substrate includes a plurality of sub-pixels, which are distributed in the display area in an array.

Exemplary, the sub-pixel includes a sub-pixel driving circuit and a light-emitting element, and the sub-pixel driving circuit is coupled to the light-emitting element to provide a driving signal for the light-emitting element, to drive the light-emitting element to emit light. Exemplary, the sub-pixel driving circuit includes a 5T1C circuit structure, that is, five thin film transistors and a storage capacitor. Exemplary, the light-emitting element includes an anode pattern, a light-emitting functional layer and a cathode layer arranged in sequence in a direction away from the base substrate; the light-emitting functional layer includes an electron injection layer, an electron transport layer, an organic light-emitting material layer, a hole transport layer and a hole injection layer laminated one on another. Exemplary, the cathode layer receives a negative power source signal VSS.

Exemplary, among the plurality of sub-pixels, the electronic injection layer included in each sub-pixel is formed into an integrated structure, which can cover the entire display area; Similarly, the electronic transport layer, the hole transport layer and the hole injection layer included in each sub-pixel can also be formed into an integrated structure, which can cover the entire display area. Exemplary, among the plurality of sub-pixels, the cathode layers included in sub-pixels are formed into an integrated structure, which can cover the entire display area.

Exemplary, at least part of the reference signal line 36 extends in the first direction. At least part of the second scan line 42 extends in the first direction.

Exemplary, the second scan lines 42 located in the sub-pixels of the same row along the first direction are sequentially coupled to form an integrated structure.

For example, the gate electrode of the driving transistor T5 is coupled to the second electrode of the second transistor T2, and the first electrode of the driving transistor T5 is coupled to the light-emitting element.

Exemplary, the second transistor T2 includes a double gate transistor, and two gate electrodes of the second transistor T2 and the second scan line 42 form an integrated structure. The two gate electrodes are arranged along the first direction. The first electrode of the second transistor T2 and the reference signal line 36 form an integrated structure.

According to the specific structure of the display substrate, in the display substrate provided by the embodiment of the present disclosure, the first electrode of the second transistor T2 and the reference signal line 36 are arranged to form an integrated structure, which can reduce the distance between the first electrode of the second transistor T2 and the reference signal line 36, reduce the layout space occupied by the sub-pixel, and reduce the layout difficulty of the sub-pixel. Moreover, it is not necessary to set other switching patterns to electrically connect the first electrode of the second transistor T2 and the reference signal line 36, thereby further reducing the layout difficulty of the display substrate.

In addition, in the display substrate provided by the embodiment of the present disclosure, the first electrode of the second transistor T2 and the reference signal line 36 are arranged to form an integrated structure, so that the first electrode of the second transistor T2 and the reference signal line 36 can be formed simultaneously in the same process, and the coupling is realized, which not only simplifies the manufacture process of the display substrate, but also reduces the manufacture cost, thereby ensuring the connection performance between the first electrode of the second transistor T2 and the reference signal line 36, and improving the production yield of the display substrate.

As shown in FIGS. 3, 4, 5, 10, 11, and 14 to 28, in some embodiments, the second transistor T2 includes a second active layer 32, which forms the first electrode and second electrode of the second transistor T2, and at least part of the reference signal line 36 extends along the first direction; at least part of the second active layer 32 extends in the first direction; at least part of the second scan line 42 extends in the first direction; at least part of an orthographic projection of the second active layer 32 on the base substrate is located between an orthographic projection of the reference signal line 36 on the base substrate and an orthographic projection of the second scan line 42 on the base substrate.

As shown in FIGS. 3, 4, 5, 10, 11, and 14 to 28, in some embodiments, the second transistor T2 includes a second active layer 32, which forms the first electrode and the second electrode of the second transistor T2. The second active layer 32 and the reference signal line 36 form an integrated structure.

Exemplary, the second active layer 32 includes at least a portion extending in the first direction.

Exemplary, the second active layer 32 is used to form the first electrode and the second electrode of the second transistor T2, as well as a channel region of the second transistor T2.

Exemplary, the reference signal line 36 is arranged at the same layer and made of the same material as the second active layer 32, and the reference signal line 36 and the second active layer 32 can be formed into an integrated structure at the same time in a same patterning process.

Exemplary, the second active layer 32 and the reference signal line 36 are arranged in a second direction, and the second direction intersects the first direction. Exemplary, the first direction includes a horizontal direction, and the second direction includes a vertical direction.

The above arranging method can reduce the distance between the second active layer 32 and the reference signal line 36, reduce the layout space occupied by the sub-pixel, and reduce the layout difficulty of the sub-pixel. Moreover, it is unnecessary to set other switching patterns to realize the electrical connection between the first electrode of the second transistor T2 and the reference signal line 36, further reducing the layout difficulty of the display substrate.

In addition, the reference signal line 36 and the second active layer 32 can form an integrated structure at the same time in the same patterning process, which not only simplifies the production process of the display substrate, reduces the production cost, but also better ensures the connection performance between the first electrode of the second transistor T2 and the reference signal line 36, and improves the production yield of the display substrate.

In addition, the reference signal line 36 and the second active layer 32 are formed into an integrated structure, so that the reference signal line 36 and the second scan line 42 are arranged in different layers, thereby reducing the probability of short circuit between the reference signal line 36 and the second scan line 42, and effectively improving the yield of the display substrate.

As shown in FIGS. 3, 4, 5, 10, 11, 14 to 28, in some embodiments, at least part of the reference signal line 36 extends in the first direction; at least part of the second active layer 32 extends in the first direction; at least part of the second scan line 42 extends in the first direction; at least part of the orthographic projection of the second active layer 32 on the base substrate is located between the orthographic projection of the reference signal line 36 on the base substrate and the orthographic projection of the second scan line 42 on the base substrate.

Exemplary, the orthographic projection of the two gate electrodes of the second transistor T2 on the base substrate is located between the orthographic projection of the reference signal line 36 on the base substrate and the orthographic projection of the second scan line 42 on the base substrate.

The gate electrode of the second transistor T2 is arranged close to the second scan line 42, and the second active layer 32 is arranged close to the reference signal line 36, which is conducive to the gate electrode of the second transistor T2 and the second scan line 42 being formed into an integrated structure, and is conducive to the second active layer 32 and the reference signal line 36 being formed into an integrated structure. Moreover, the above arranging method can minimize the layout space occupied by the second transistor T2, the reference signal line 36 and the second scan line 42, which is conducive to reducing the layout difficulty of the display substrate.

As shown in FIGS. 3, 4, 5, 7, 10, 11, and 14 to 28, in some embodiments, the sub-pixel also includes a first scan line 41, a data line 62, and a first connection pattern 61; the sub-pixel driving circuit also includes a first transistor T1;

The gate electrode of the first transistor T1 is coupled to the first scan line 41, the first electrode of the first transistor T1 is coupled to the data line 62, and the second electrode of the first transistor T1 is coupled to the gate electrode of the driving transistor T5;

The first connection pattern 61 is respectively coupled to the second electrode of the first transistor T1 and the second electrode of the second transistor T2. The orthographic projection of the first connection pattern 61 on the base substrate overlaps the orthographic projection of the first scan line 41 on the base substrate and the orthographic projection of the second scan line 42 on the base substrate, respectively.

Exemplary, the first scan line 41 includes at least a portion extending in the first direction. The first scan lines 41 located in the sub-pixels of the same row along the first direction are sequentially coupled to form an integrated structure.

Exemplary, the data line 62 includes at least a portion extending along the second direction, and the data lines 62 located in sub-pixels of the same column along the second direction are sequentially coupled to form an integrated structure.

Figure 7:
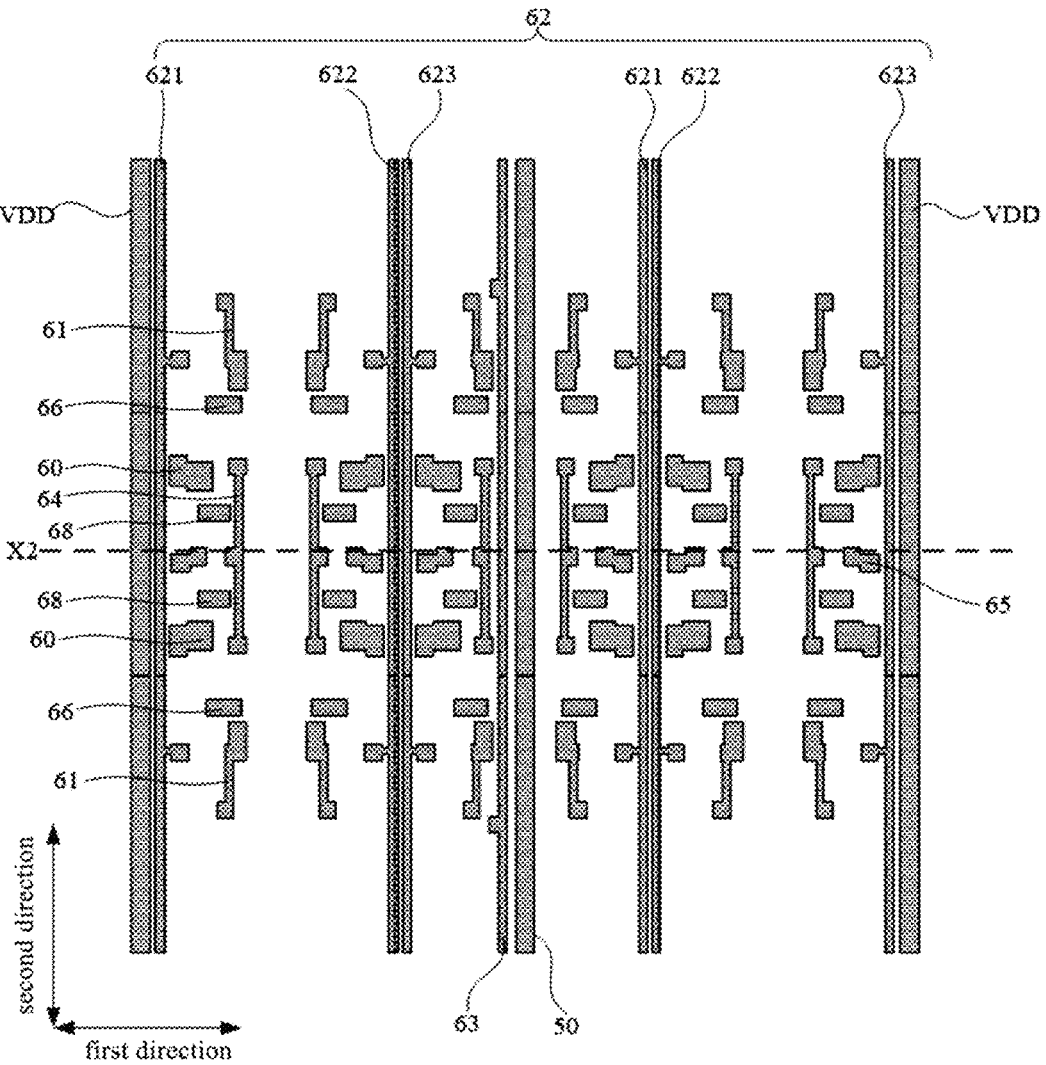
FIG. 7 is the layout diagram of the first source-drain metal layer in FIG. 3.
Figure 14:
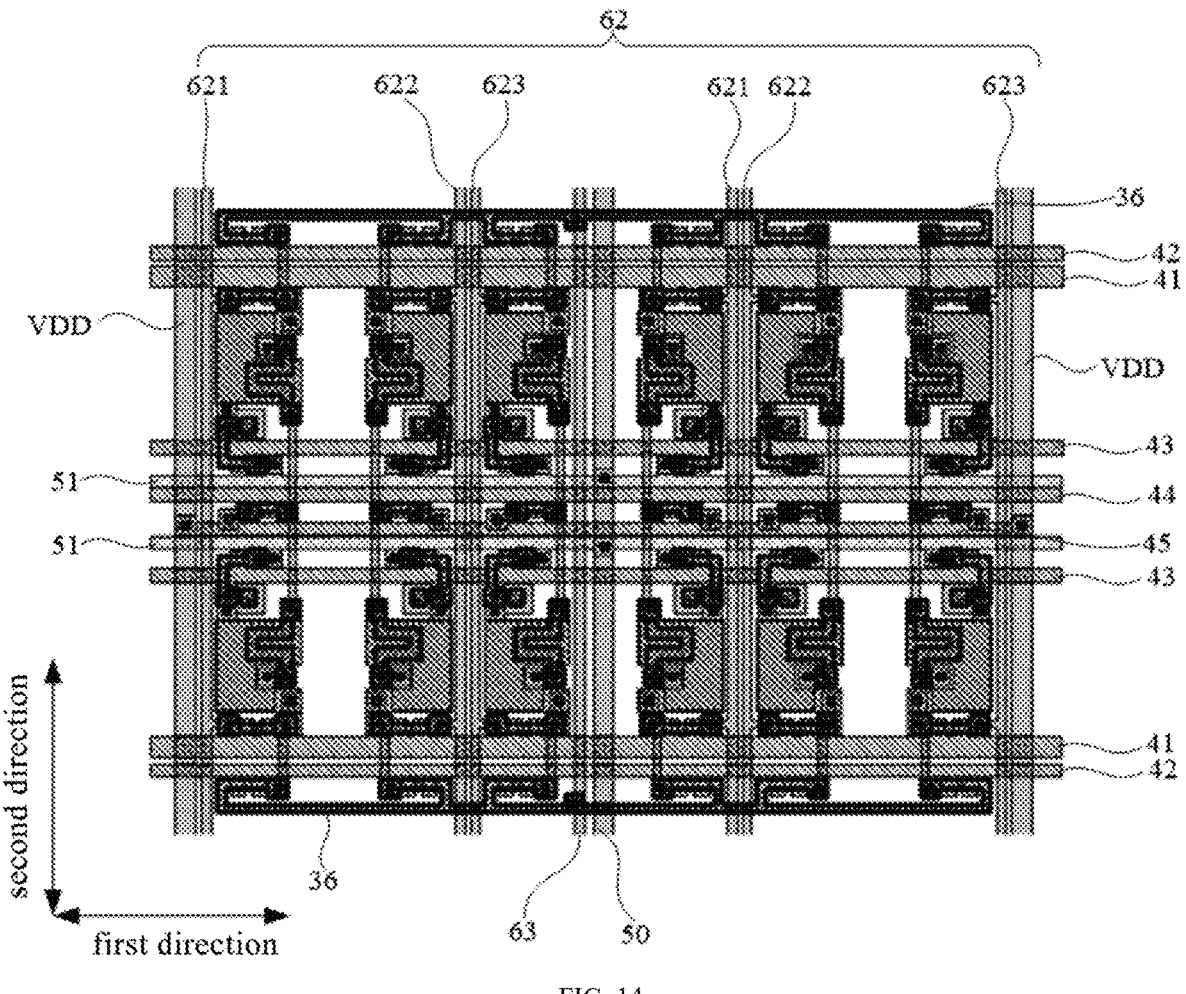
FIG. 14 is the layout diagram of the second gate metal layer and the first source-drain metal layer added in FIG. 10.
Figure 15:
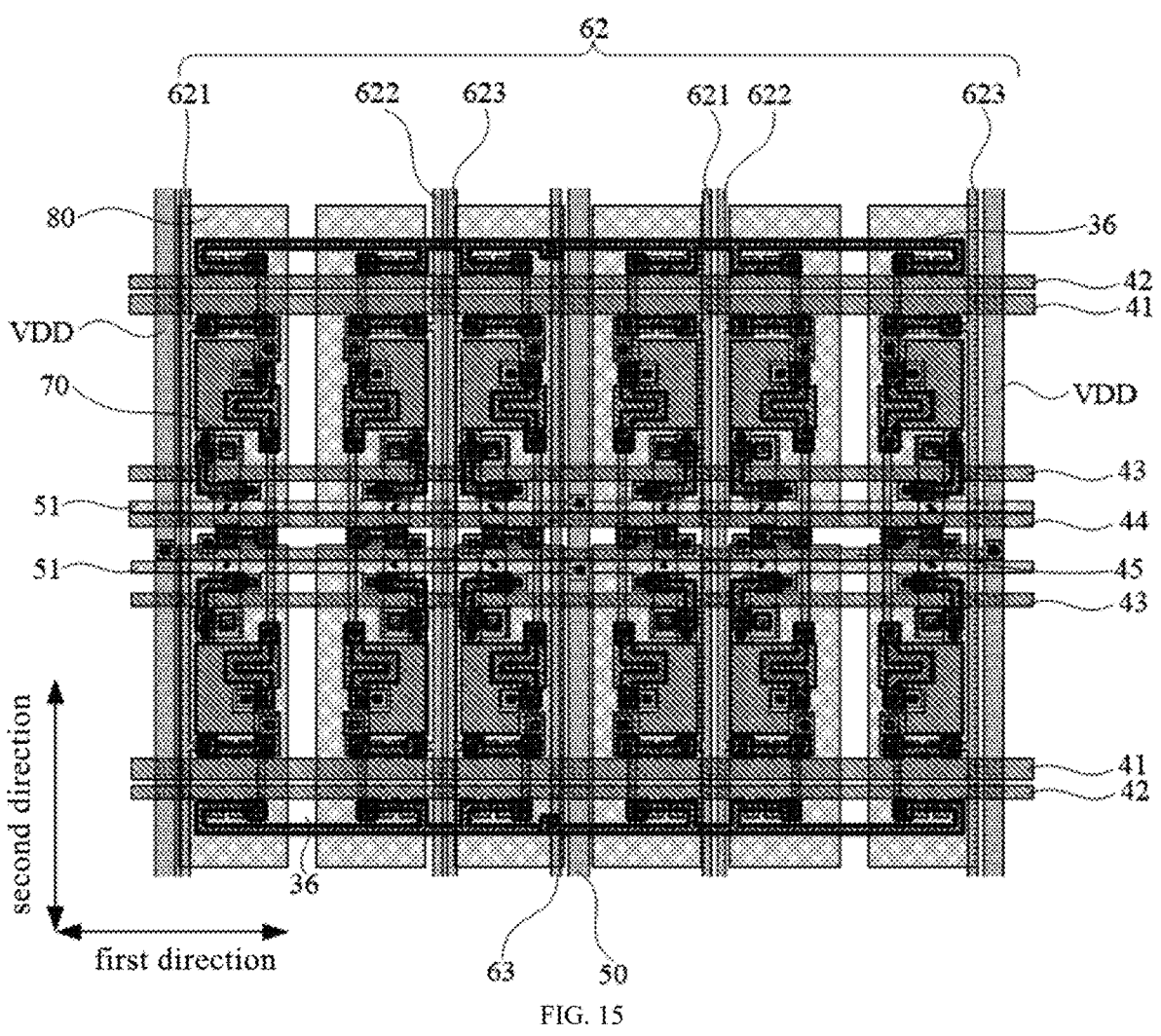
FIG. 15 is the layout diagram of the second source-drain metal layer and anode layer added in FIG. 14.
Figure 16:
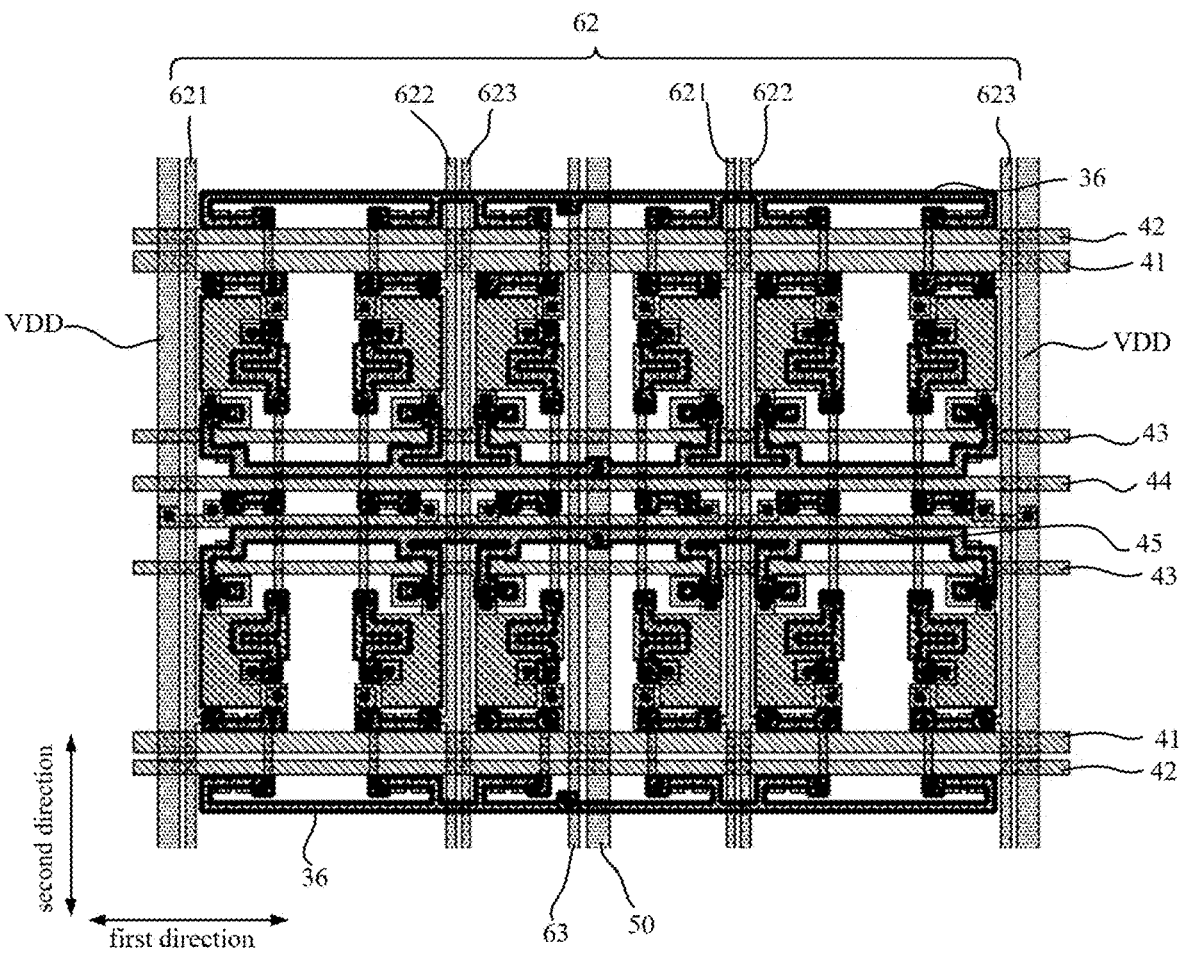
FIG. 16 is the second layout diagram corresponding to the circuit diagram in FIG. 1.
Figure 17:
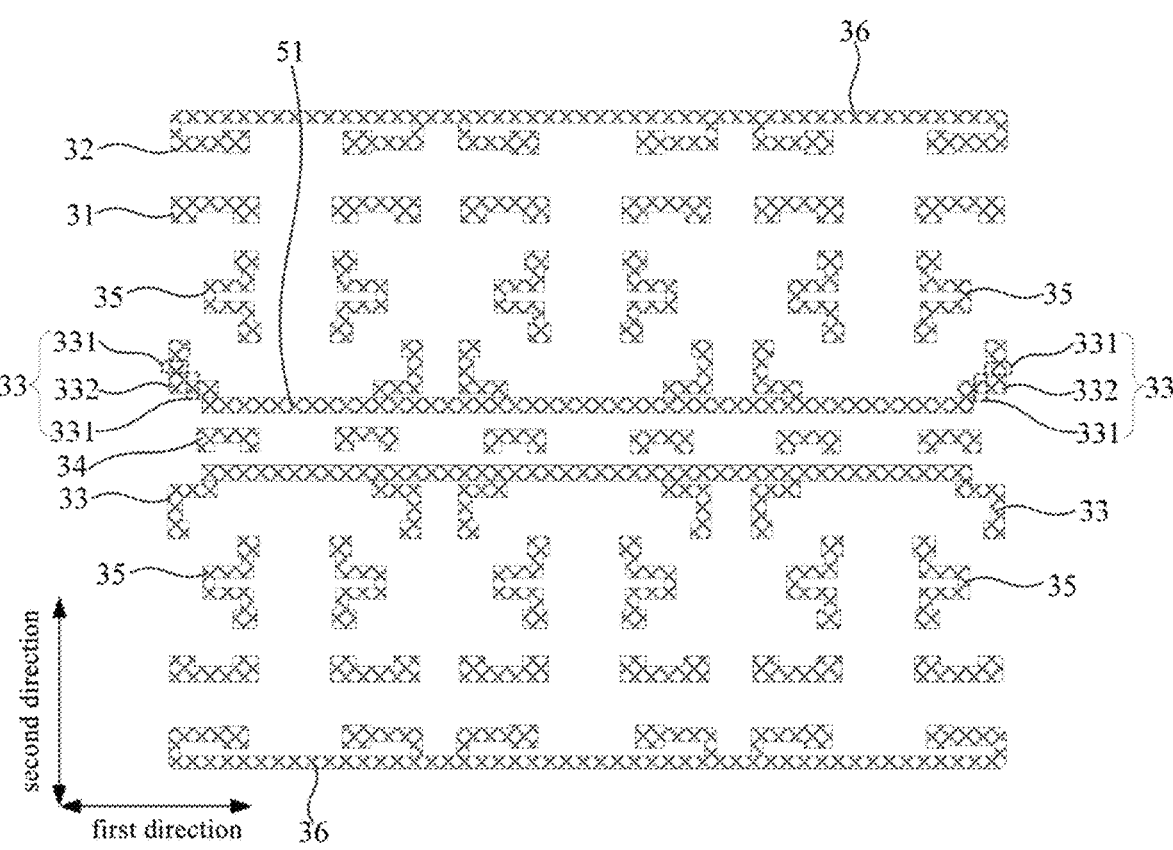
FIG. 17 is a schematic diagram of the active layer in FIG. 16.

As shown in FIG. 7, FIG. 14 and FIG. 15, each repeating unit includes four pixel units, and each pixel unit includes a first sub-pixel, a second sub-pixel and a third sub-pixel arranged along the first direction. The first sub-pixel is coupled to the first data line 621, the second sub-pixel is coupled to the second data line 622, and the third sub-pixel is coupled to the third data line 623.

Exemplary, the colors of the first sub-pixel, the second sub-pixel and the third sub-pixel are different. Exemplary, the first sub-pixel includes a red sub-pixel, the second sub-pixel includes a green sub-pixel, and the third sub-pixel includes a blue sub-pixel. It should be noted that FIG. 1 shows the red data signals DATAR1 and DATAR2 received by the red sub-pixel, the green data signals DATAG1 and DATAG2 received by the green sub-pixel, and the blue data signals DATAB1 and DATAB2 received by the blue sub-pixel.

Exemplary, the first transistor T1 includes a double gate structure, two gate electrodes of the first transistor T1 are arranged along the first direction, and the two gate electrodes and the first scan line 41 are formed into an integrated structure. The first transistor T1 includes a first active layer 31, which includes at least a portion extending in the first direction. The orthographic projection of the first active layer 31 on the base substrate at least partially overlaps the orthographic projection of the two gate electrodes on the base substrate. The first active layer 31 forms the first electrode and the second electrode of the first transistor T1, and the channel region of the first transistor T1.

Exemplary, along the second direction, the orthographic projection of the reference signal line 36 on the base substrate, the orthographic projection of the second active layer 32 on the base substrate, the orthographic projection of the second scan line 42 on the base substrate, the orthographic projection of the first scan line 41 on the base substrate, and the orthographic projection of the first active layer 31 on the base substrate are arranged in sequence.

Exemplary, the first connection pattern 61 includes at least a portion extending in the second direction. The first connection pattern 61 is coupled to the second electrode of the first transistor T1 through a via hole, the first connection pattern 61 is coupled to the second electrode of the second transistor T2 through a via hole, and the first connection pattern 61 is coupled to the gate electrode of the driving transistor T5 through a via hole.

Exemplary, the first connection pattern 61 is made of the first source-drain metal layer in the display substrate.

The layout of the first transistor T1, the second transistor T2, the first scan line 41 and the second scan line 42 in the above manner is conducive to reducing the layout space occupied by the sub-pixel, reducing the layout difficulty of the sub-pixel, and improving the yield of the display substrate.

As shown in FIG. 3, FIG. 4, FIG. 7, FIG. 10, FIG. 11, and FIGS. 14 to 28, in some embodiments, the plurality of sub-pixels are divided into a plurality of repeating units, and the plurality of repeating units are divided into a plurality of columns of repeating units; the display substrate also includes a plurality of power lines VDD, and the power lines VDD and the columns of repeating units are alternately arranged along the first direction;

In each repeating unit, the reference signal lines 36 located in sub-pixels of the same row along the first direction form an integrated structure; the orthographic projection of the reference signal line 36 on the base substrate does not overlap the orthographic projection of the power line VDD on the base substrate.

Exemplary, the plurality of repeating cells are arranged in an array, the plurality of repeating cells are divided into a plurality of columns of repeating units, and each column of repeating units include a plurality of repeating units arranged along the second direction.

Exemplary, the power line VDD includes at least a portion extending along the second direction. Exemplary, the orthographic projection of the columns of repeating units on the base substrate is located between the orthographic projections of adjacent power line VDD on the base substrate.

Exemplary, the repeating unit also includes a reference signal bus 63, which includes at least a portion extending along the second direction. The reference signal bus 63 is coupled to the reference signal line 36 in the repeating unit.

Exemplary, the repeating unit includes two rows of and six columns of sub-pixels arranged in an array. In the two rows of sub-pixels, the reference signal lines 36 in each row of sub-pixels are formed into an integrated structure, and are coupled to the reference signal bus 63 through a via hole. The six columns of sub-pixels are divided into two groups of sub-pixels, each group of sub-pixels includes three columns of sub-pixels, and the orthogonal projection of the reference signal bus 63 on the base substrate is located between the orthogonal projections of two groups of sub-pixels on the base substrate.

Exemplary, reference signal buses 63 included in the same column of repeating units are sequentially coupled to form an integrated structure.

The reference signal line 36 located in sub-pixels of the same row along the first direction are formed into an integrated structure, and are coupled to the reference signal bus 63 to provide the reference signal for the reference signal line 36 through the reference signal bus 63, thus ensuring the normal operation of the display substrate.

The orthographic projection of the reference signal line 36 on the base substrate does not overlap the orthographic projection of the power line VDD on the base substrate, thereby reducing the risk of short circuit between the reference signal line 36 and the power line VDD.

As shown in FIGS. 16 to 22 and FIGS. 26 to 28, in some embodiments, the sub-pixel also includes a third scan line 43 and an initialization signal line 51;

The sub-pixel driving circuit also includes a third transistor T3, the gate electrode of the third transistor T3 is coupled to the third scan line 43, the first electrode of the third transistor T3 and the initialization signal line 51 form an integrated structure, and the second electrode of the third transistor T3 is coupled to the first electrode of the driving transistor T5.

Exemplary, the third scan line 43 includes at least a portion extending in the first direction. The third scan lines 43 in the same row of sub-pixels are sequentially coupled to form an integrated structure.

Exemplary, the initialization signal line 51 includes at least a portion extending in the first direction. The initialization signal lines 51 in the same row of sub-pixels are sequentially coupled to form an integrated structure.

Exemplary, the third transistor T3 includes a double gate structure. The orthographic projection of the first electrode of the third transistor T3 on the base substrate and the orthographic projection of the initialization signal line 51 on the base substrate are located on the same side of the orthographic projection of the third scan line 43 on the base substrate.

In the display substrate provided by the above embodiment, the first electrode of the third transistor T3 and the initialization signal line 51 are arranged to form an integrated structure, which can reduce the distance between the first electrode of the third transistor T3 and the initialization signal line 51, reduce the layout space occupied by the sub-pixel, and reduce the layout difficulty of the sub-pixel. Moreover, it is not necessary to set other switching patterns to electrically connect the first electrode of the third transistor T3 and the initialization signal line 51, which further reduces the layout difficulty of the display substrate.

In addition, in the display substrate provided by the above embodiment, the first electrode of the third transistor T3 and the initialization signal line 51 are arranged to form an integrated structure, so that the first electrode of the third transistor T3 and the initialization signal line 51 can be formed simultaneously in the same process, and realize coupling, which not only simplifies the production process of the display substrate, but also reduces the production cost, thereby ensuring the connection performance of the first electrode of the third transistor T3 and the initialization signal line 51, and improving the production yield of the display substrate.

As shown in FIGS. 16 to 28 and FIGS. 26 to 28, in some embodiments, the third transistor T3 includes a third active layer 33, the third active layer 33 forms the first electrode and the second electrode of the third transistor T3, and the third active layer 33 and the initialization signal line 51 form an integrated structure.

Exemplary, the third active layer 33 includes an L-shaped structure. The third active layer 33 is used to form the first electrode, the second electrode and the channel region of the third transistor T3. A part of the third active layer 33 used to form the first electrode of the third transistor T3 and the initialization signal line 51 form an integrated structure.

The third active layer 33 and the initialization signal line 51 form an integrated structure, which can reduce the distance between the third active layer 33 and the initialization signal line 51, reduce the layout space occupied by the sub-pixel, and reduce the layout difficulty of the subpixel. Moreover, it is not necessary to set other switching patterns to realize the electrical connection between the first electrode of the third transistor T3 and the initialization signal line 51, further reducing the layout difficulty of the display substrate.

In addition, the initialization signal line 51 and the third active layer 33 can form an integrated structure at the same time in the same patterning process, which not only simplifies the production process of the display substrate and reduces the production cost, but also better ensures the connection performance of the first electrode of the third transistor T3 and the initialization signal line 51, and improves the production yield of the display substrate.

In addition, the initialization signal line 51 and the third active layer 33 are formed into an integrated structure, so that the initialization signal line 51 and the third scan line 43 are arranged in different layers, thereby reducing the probability of short circuit between the initialization signal line 51 and the third scan line 43, and effectively improving the production yield of the display substrate.

As shown in FIGS. 16 to 28, and FIGS. 26 to 28, in some embodiments, in each repeating unit, initialization signal lines 51 located in the same row of sub-pixels along the first direction are formed into an integrated structure; the orthographic projection of the initialization signal line 51 on the base substrate does not overlap the orthographic projection of the power line VDD on the base substrate.

Exemplary, the initialization signal lines 51 located in sub-pixels of the same row along the first direction are sequentially coupled to form an integrated structure.

The orthographic projection of the initialization signal line 51 on the base substrate does not overlap the orthographic projection of the power line VDD on the base substrate, which can reduce the risk of short circuit between the initialization signal line 51 and the power line VDD.

As shown in FIG. 3, FIG. 6, FIG. 7, FIG. 11, FIG. 14, FIG. 15, FIG. 16 and FIG. 26, in some embodiments, the repeating unit includes an initialization signal bus 50, at least part of the initialization signal bus 50 extends in the second direction, and the second direction intersects the first direction; the initialization signal bus 50 is coupled to the initialization signal line 51.

Exemplary, the repeating unit includes two rows of and six columns of sub-pixels arranged in an array. In the two rows of sub-pixels, the initialization signal lines 51 in each row of sub-pixels are formed into an integrated structure, and is coupled to the initialization signal bus 50 through a via hole. The six column of sub-pixels are divided into two groups of sub-pixels, each group of sub-pixels includes three columns of sub-pixels. The orthographic projection of the initialization signal bus 50 on the base substrate is located between the orthographic projections of two groups of sub-pixels on the base substrate.

Exemplary, initialization signal buses 50 included in the same column of repeating units are sequentially coupled to form an integrated structure.

The initialization signal lines 51 located in sub-pixels of the same row along the first direction are formed into an integrated structure, and are coupled to the initialization signal bus 50 to provide the initialization signal for the initialization signal line 51 through the initialization signal bus 50, thereby ensuring the normal operation of the display substrate.

Figure 23:
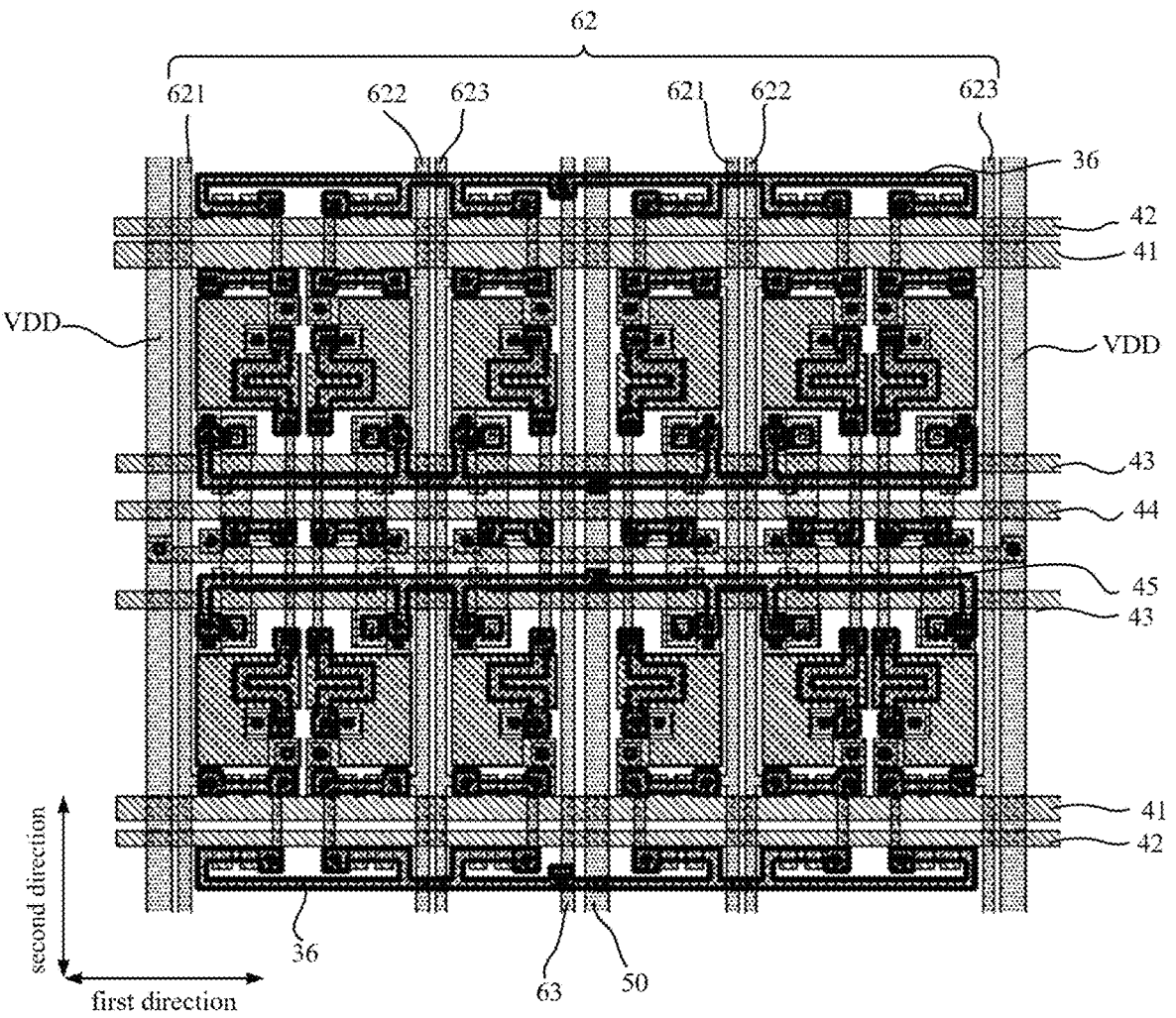
FIG. 23 is the third layout diagram corresponding to the circuit diagram in FIG. 1.
Figure 24:
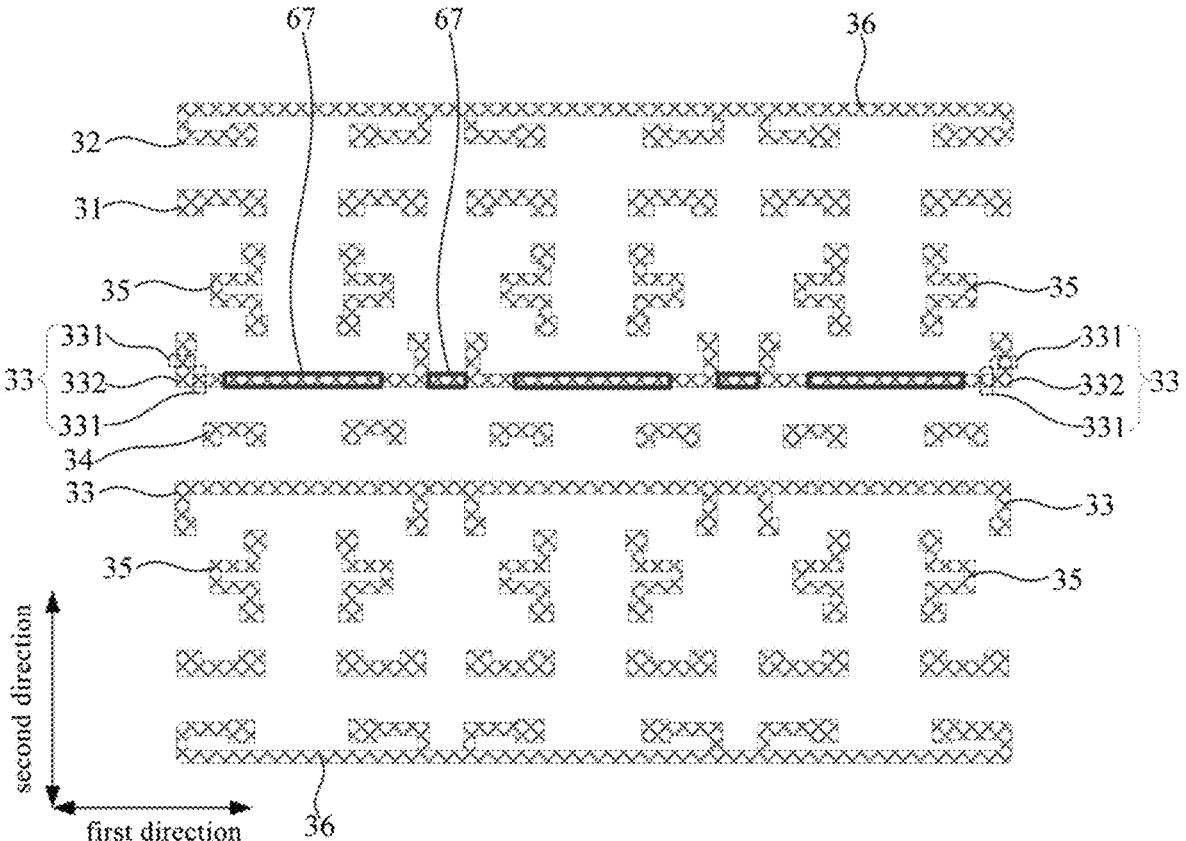
FIG. 24 is a schematic diagram of the active layer in FIG. 23.
Figure 25:
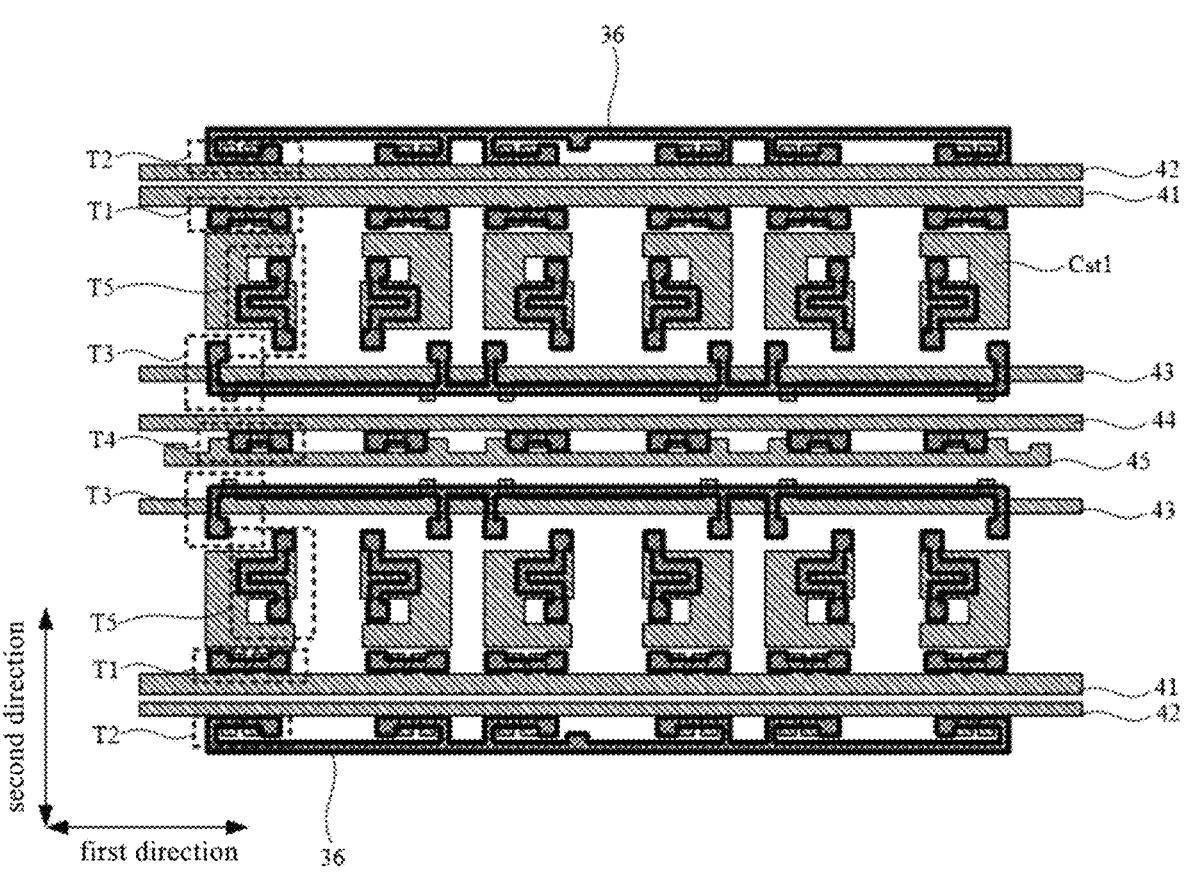
FIG. 25 is the layout diagram of the active layer and the first gate metal layer in FIG. 23.

As shown in FIGS. 23 to 25, in some embodiments, the third transistor T3 includes a double gate structure, the third transistor T3 includes a third active layer 33, the third active layer 33 includes two third channel portions 331, and a conductor portion 332 which is respectively coupled to the two third channel portions 331;

The repeating unit includes a plurality of second connection patterns 67. In the repeating unit, along the first direction, the first electrodes of the adjacent third transistors T3 are coupled through the second connection pattern 67, or the conductor portions 332 of the adjacent third transistors T3 are coupled through the second connection pattern 67; the orthographic projection of the second connection pattern 67 on the base substrate is located between the orthographic projections of part of gate electrodes of two adjacent third transistors T3 coupled to the second connection pattern 67 on the base substrate;

The repeating unit also includes an initialization signal bus 50, the initialization signal bus 50 extends along a second direction, the second direction intersects the first direction, and the initialization signal bus 50 is coupled to the second connection pattern 67.

Exemplary, in the repeating unit, among the sub-pixels of the same row along the first direction, the first electrodes of one part of the adjacent third transistors T3 are coupled through the second connection pattern 67, and the conductor portions 332 of the other part of the adjacent third transistors T3 are coupled through the second connection pattern 67.

Exemplary, the repeating unit includes two rows of and six columns of sub-pixels arranged in an array. The first row of sub-pixels in the repeating unit is taken as an example. The first electrode of the third transistor T3 in the first sub-pixel is coupled to the first electrode of the third transistor T3 in the second sub-pixel through the second connection pattern 67. The conductor portion 332 of the third transistor T3 in the second sub-pixel is coupled to the conductor portion 332 of the third transistor T3 in the third sub-pixel through the second connection pattern 67. The first electrode of the third transistor T3 in the third sub-pixel is coupled to the first electrode of the third transistor T3 in the fourth sub-pixel through the second connection pattern 67. The conductor portion 332 of the third transistor T3 in the fourth sub-pixel is coupled to the conductor portion 332 of the third transistor T3 in the fifth sub-pixel through the second connection pattern 67. The first electrode of the third transistor T3 in the fifth sub-pixel is coupled to the first electrode of the third transistor T3 in the sixth sub-pixel through the second connection pattern 67.

Exemplary, the initialization signal bus 50 is coupled to the second connection pattern 67 through a via hole.

Exemplary, the second connection pattern 67 between the third transistor T3 in the third sub-pixel and the third transistor T3 in the fourth sub-pixel is coupled to the initialization signal bus 50 through a via hole.

In the above arrangement, in the repeating unit, along the first direction, the first electrodes of the adjacent third transistors T3 are coupled through the second connection pattern 67, or the conductor portions 332 of the adjacent third transistors T3 are coupled through the second connection pattern 67. In the repeating unit, the third transistors T3 located in the same row along the first direction are connected in series, the third transistors T3 can be turned on when the third scan line 43 provides an effective scanning signal, and the initialization signal provided by the initialization signal bus 50 is transmitted to the corresponding sub-pixel.

Exemplary, the third active layer 33 includes an L-shaped structure, the gate electrode of the third transistor T3 includes a first gate pattern and a second gate pattern, a part of the third scan line 43 is multiplexed into the first gate pattern, the second gate pattern and the third scan line 43 are formed into an integrated structure, and the second gate pattern is located on one side of the third scan pattern along the second direction. The orthographic projection of the first gate pattern on the base substrate and the orthographic projection of the second gate pattern on the base substrate at least partially overlap the orthographic projection of the third active layer 33 on the base substrate, respectively.

Exemplary, the orthographic projection of the second connection pattern 67 on the base substrate is located between the orthographic projections of the second gate patterns of two adjacent third transistors T3 coupled to the second connection pattern 67 on the base substrate.

The orthographic projection of the second connection pattern 67 on the base substrate is located between the orthographic projections of and the part of the gate electrodes of two adjacent third transistors T3 coupled to the second connection pattern on the base substrate, which is conducive to reducing the layout space occupied by subpixels, reducing the layout difficulty of the display substrate, and is conducive to achieving high resolution of the display substrate.

As shown in FIGS. 23 to 25, in some embodiments, the first electrode or the conductor portion 332 of the third transistor T3 coupled to the second connection pattern 67 and the second connection pattern 67 form an integrated structure.

The above setting mode enables the second connection pattern 67 and the first electrode of the third transistor T3 to be formed in the same patterning process, which not only simplifies the production process of the display substrate, but also reduces the production cost of the display substrate. Moreover, the above setting mode also improves the electrical connection performance between the second connection pattern 67 and the first electrode of the third transistor T3, and ensures the yield of the display substrate.

Figure 26:
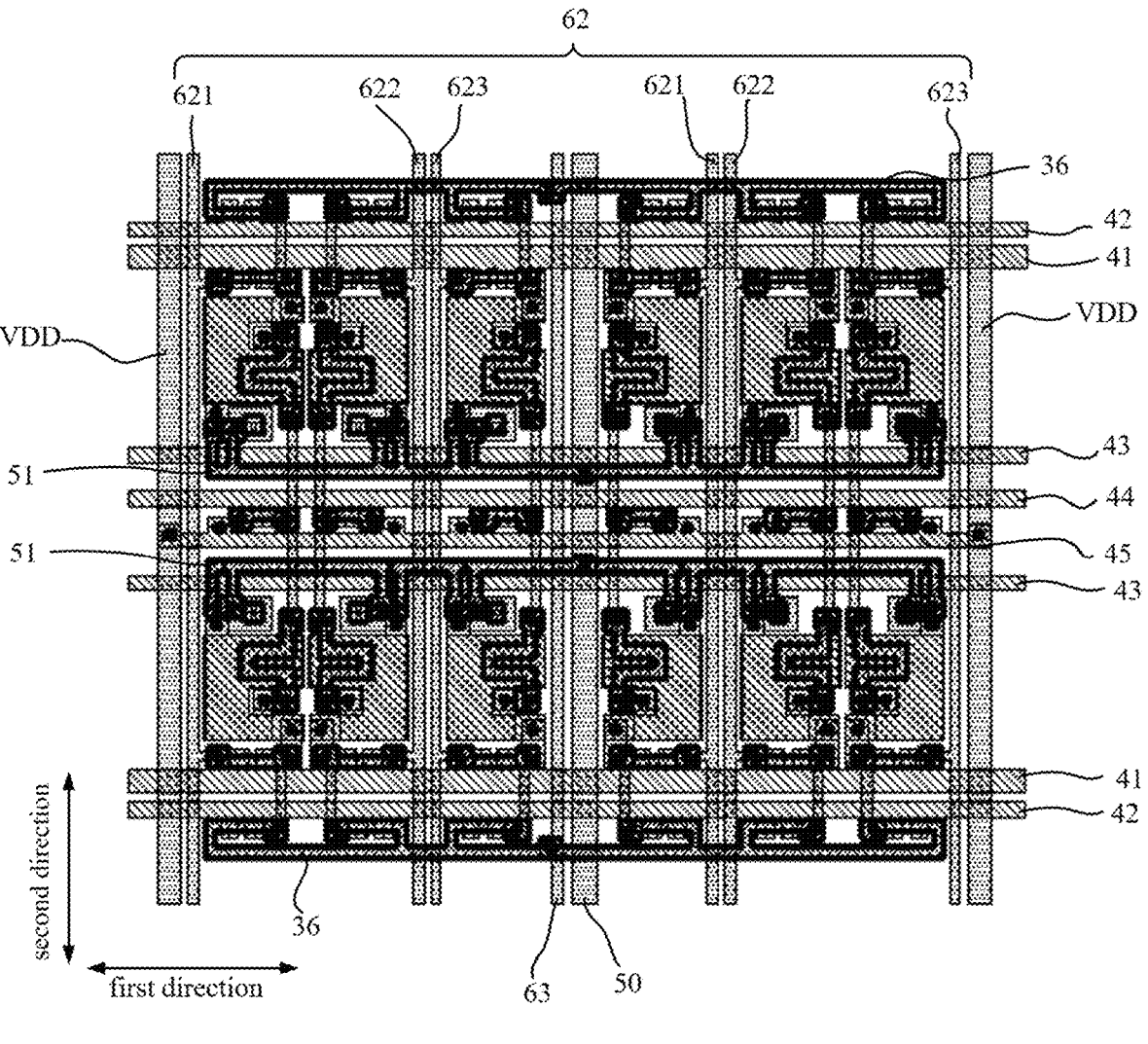
FIG. 26 is the fourth layout diagram corresponding to the circuit diagram in FIG. 1.
Figure 27:
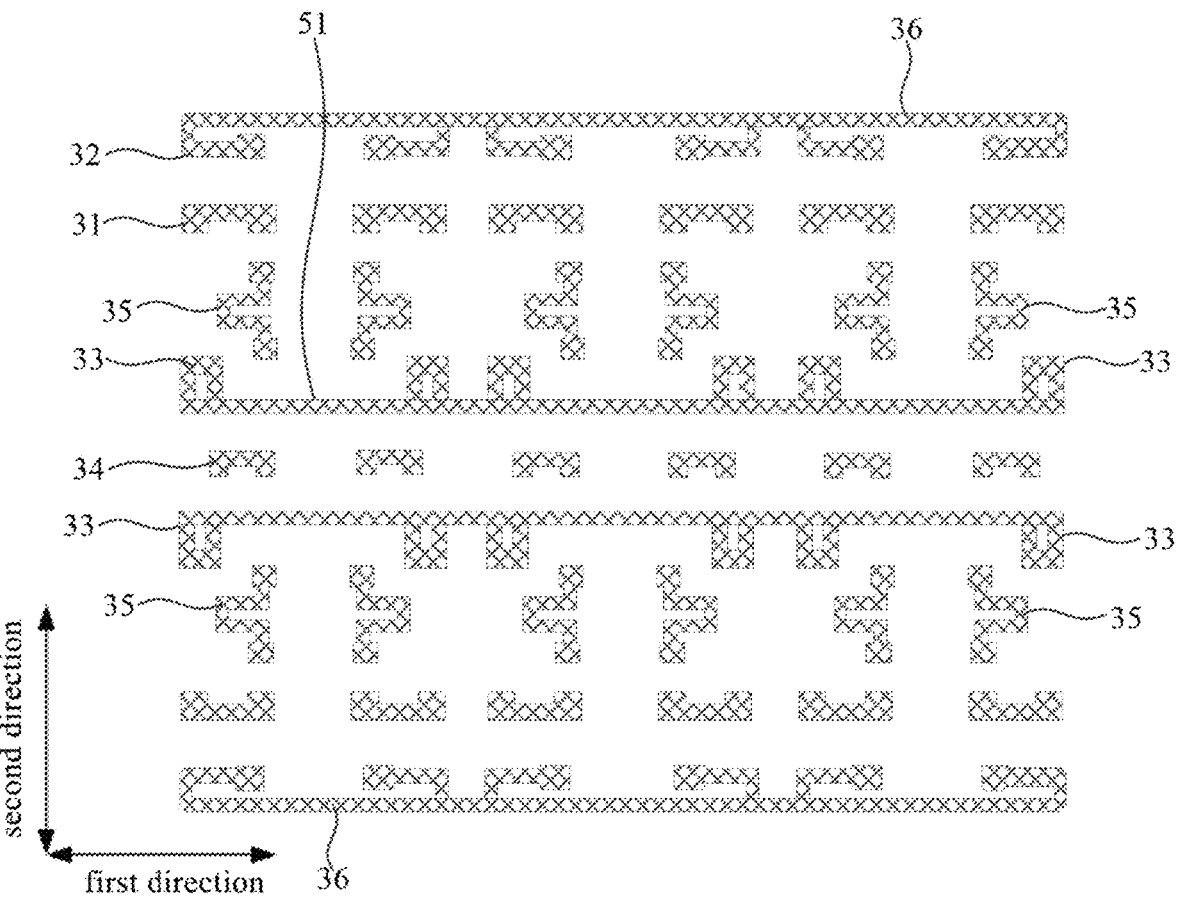
FIG. 27 is a schematic diagram of the active layer in FIG. 26.
Figure 28:
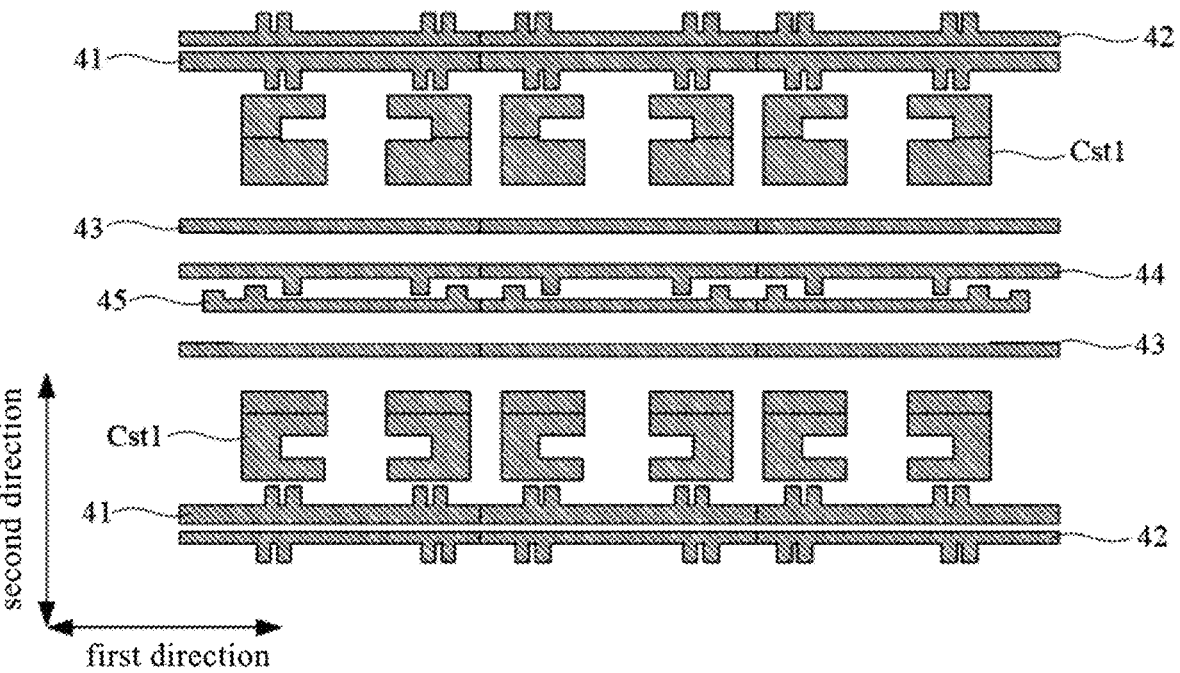
FIG. 28 is the layout diagram of the first gate metal layer in FIG. 26.

As shown in FIGS. 26 to 28, in some embodiments, the third active layer 33 includes a U-shaped structure, and there are two overlapping areas between the orthographic projection of the third active layer 33 on the base substrate and the orthographic projection of the third scan line 43 on the base substrate; two ends of the third active layer 33 at the U-shaped opening are respectively coupled to the initialization signal line 51; a part of the third active layer 33 at the bottom of the U-shape is coupled to the first electrode of the driving transistor T5.

Exemplary, the opening of the U-shaped structure faces the initialization signal line 51 coupled thereto. The U-shaped structure and the initialization signal line 51 form an integrated structure.

Exemplary, in a repeating unit, the third scan lines 43 located in sub-pixels of the same row along the first direction are sequentially coupled to form an integrated strip structure extending along the first direction.

The third transistor T3 is of a double gate structure, and the third scan line 43 is multiplexed as the gate electrode of the third transistor T3.

The above setting mode is conducive to reducing the layout space occupied by the sub-pixel, and is conducive to achieving high resolution of the display substrate.

Figure 10:
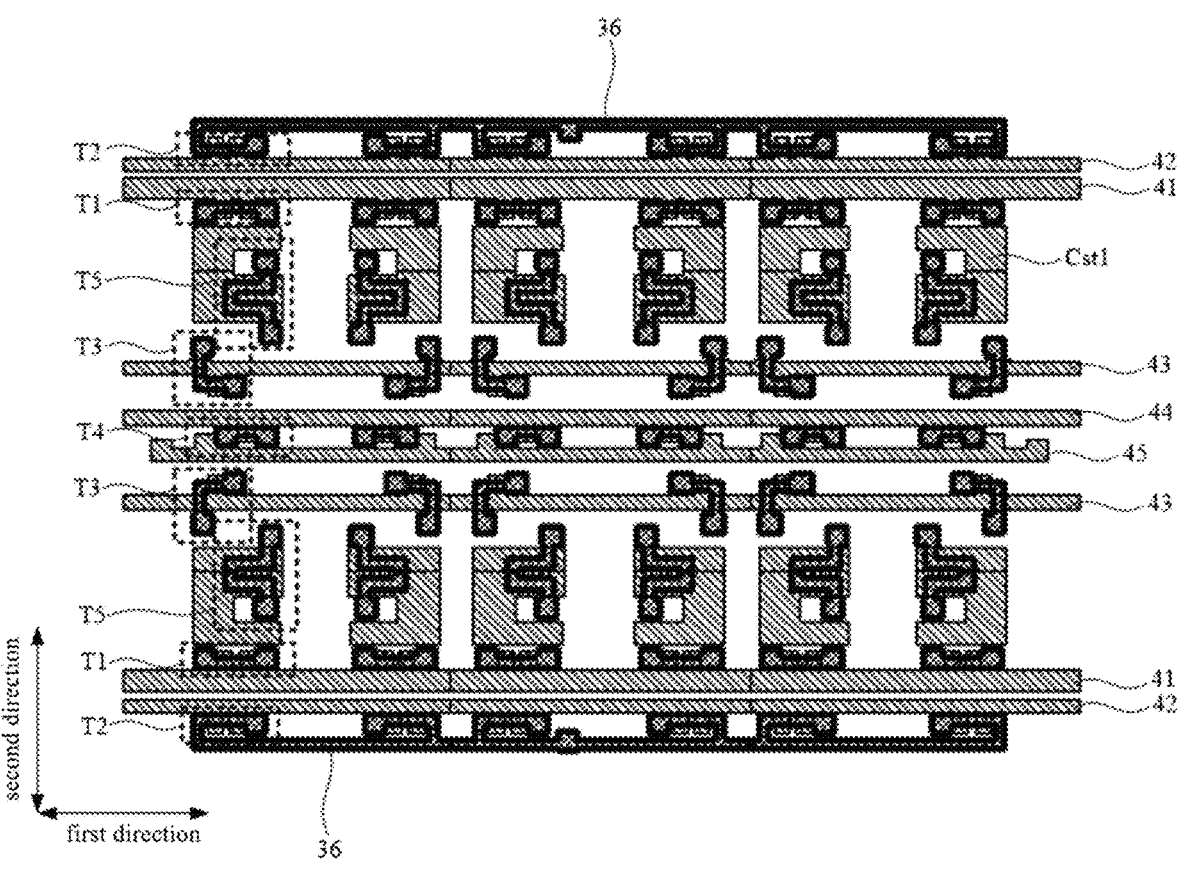
FIG. 10 is the layout diagram of the active layer and the first gate metal layer in FIG. 3.
Figure 11:
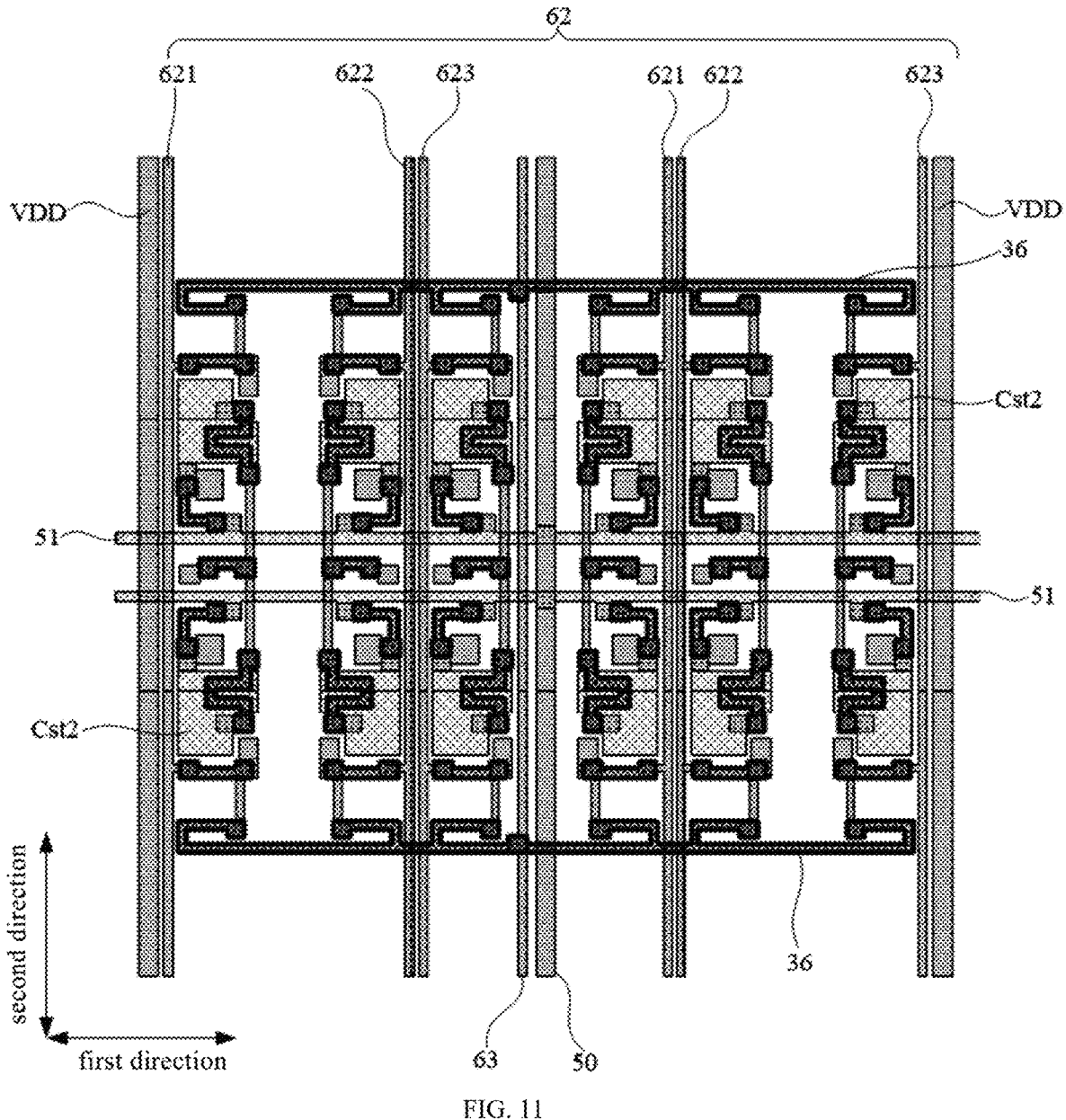
FIG. 11 is the layout diagram of the active layer, the second gate metal layer and the first source-drain metal layer in FIG. 3.
Figure 12:
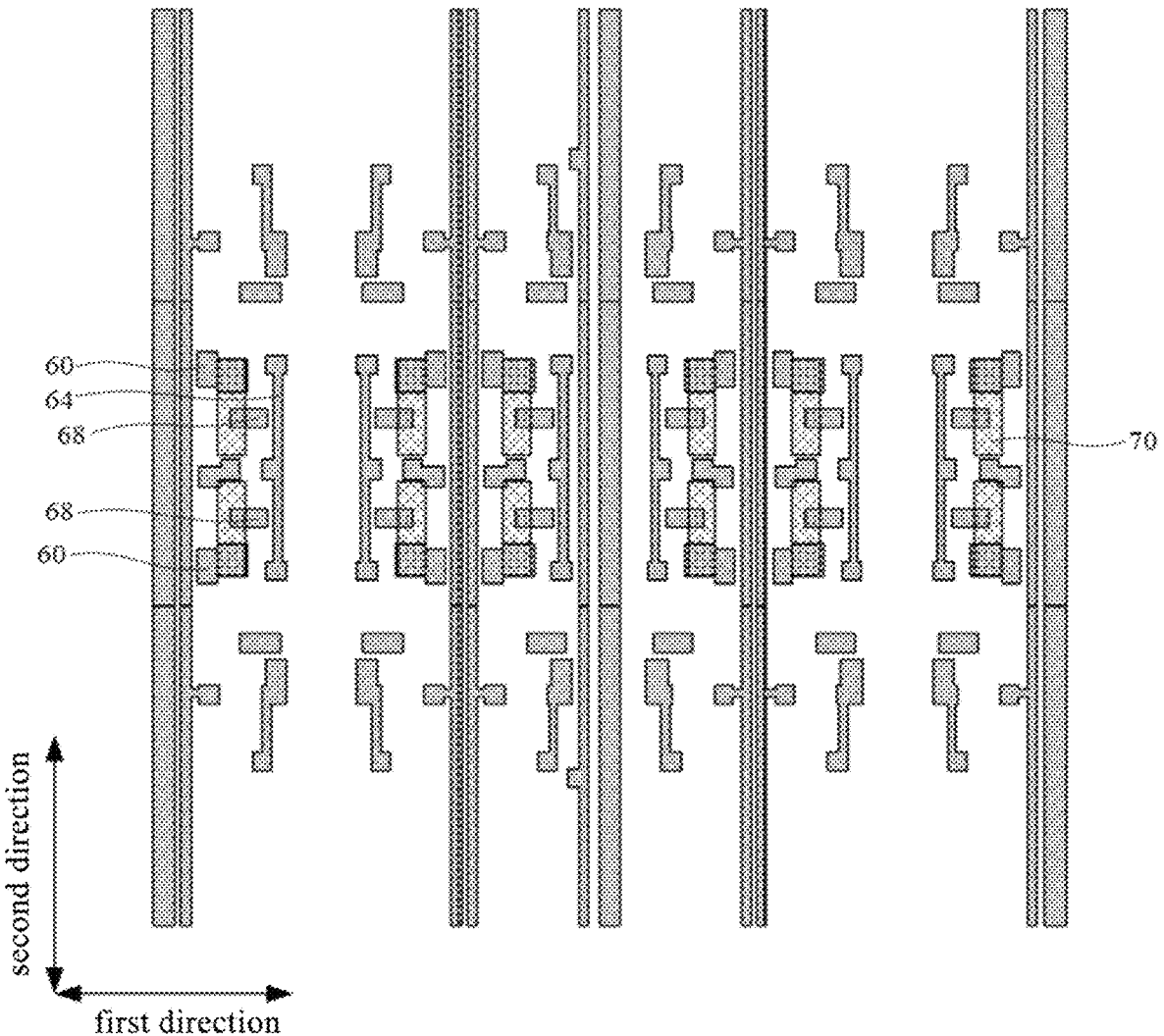
FIG. 12 is the layout diagram of the first source-drain metal layer and the second source-drain metal layer in FIG. 3.

As shown in FIG. 10, FIG. 14 and FIG. 15, in some embodiments, the sub-pixel also includes a light-emitting control line 44;

The sub-pixel driving circuit also includes a fourth transistor T4, the gate electrode of the fourth transistor T4 is coupled to the light-emitting control line 44, the first electrode of the fourth transistor T4 is coupled to the power line VDD, and the second electrode of the fourth transistor T4 is coupled to the second electrode of the driving transistor T5;

In the same repeating unit, a same fourth transistor T4 is multiplexed by the adjacent sub-pixel driving circuits along the second direction, and the same light-emitting control signal line is multiplexed by the adjacent sub-pixel driving circuits along the second direction.

Exemplary, the light-emitting control line 44 includes at least a portion extending in the first direction.

Exemplary, the fourth transistor T4 is used to control the driving transistor T5 to write a driving signal to the anode pattern 80, thereby controlling the light emitting element.

Exemplary, the same fourth transistor T4 is multiplexed by the adjacent sub-pixel driving circuits along the second direction, the multiplexed fourth transistor T4 is respectively coupled to the two driving transistors T5 in the adjacent sub-pixel driving circuits, and the multiplexed fourth transistor T4 separately controls the two driving transistors T5 to write driving signals to the corresponding anode pattern 80.

In the display substrate provided by the above embodiment, the adjacent sub-pixel driving circuits in the second direction share the same fourth transistor T4 and the same light emitting control signal line through being arranged in the same repeating unit; thereby reducing the number of the fourth transistors T4 and the number of light emitting control signal lines in the display substrate, and effectively reducing the layout space occupied by the repeating unit. Therefore, the display substrate provided by the above embodiment has optimized the layout of the plurality of sub-pixels, which not only ensures that the display substrate can achieve high-resolution display, but also is better compatible with Gate On Array (GOA) logic resources.

As shown in FIG. 10, FIGS. 13 to 15, in some embodiments, the sub-pixel includes an anode pattern 80;

The fourth transistor T4 includes a fourth active layer 34. The orthographic projection of the fourth active layer 34 on the base substrate is located between the orthographic projections of two adjacent anode patterns 80 along the second direction on the base substrate.

Exemplary, the fourth active layer 34 includes at least a portion extending in the first direction.

Exemplary, the orthographic projection of the light emitting control signal line on the base substrate is located between the orthographic projections of two adjacent anode patterns 80 along the second direction on the base substrate.

Exemplary, the sub-pixel also includes a power connection portion 45, the power connection portion 45 and the fourth active layer 34 are arranged at different layers, the power connection portion 45 and the power line VDD are arranged at different layers, the power connection portion 45 is coupled to the first electrode of the fourth transistor T4 through the second conductive pattern 65, and the power connection portion 45 is coupled to the power line VDD through a via hole, The via hole penetrates the insulating layer between the power connection portion 45 and the power line VDD.

The fourth transistor T4 and the light-emitting control signal line are roughly located between the two multiplexed sub-pixels, which not only ensures the good connection performance between the fourth transistor T4 and the light-emitting control signal line, as well as the two driving transistors T5, but also effectively reduces the layout difficulty of the light-emitting control signal line and the fourth transistor T4.

As shown in FIGS. 4 to 7 and FIGS. 10 to 15, in some embodiments, the driving transistor T5 includes a driving active layer 35;

Among the two adjacent subpixels along the first direction, the two driving active layers 35 included in the two driving transistors T5 are symmetrically arranged about the first symmetry axis, the first symmetry axis extends along the second direction, and the orthographic projection of the first symmetry axis on the base substrate is located between the orthographic projections of the two anode patterns 80 included in the two adjacent subpixels along the first direction on the base substrate;

Among the two sub-pixels adjacent in the second direction, the two driving active layers 35 included in the two driving transistors T5 are symmetrically arranged about the second symmetry axis X2. The second symmetry axis X2 extends in the first direction. The orthographic projection of the second symmetry axis X2 on the base substrate is located between the orthographic projections of the two anode patterns 80 included in the two sub-pixels adjacent in the second direction on the base substrate.

As shown in FIGS. 4 to 7 and FIGS. 10 to 15, for example, the second electrode of the driving transistor T5 is coupled to the second electrode of the fourth transistor T4 through the first conductive pattern 64, the first electrode of the driving transistor T5 is coupled to the second electrode plate Cst2 of the storage capacitor Cst, and is coupled to the anode pattern 80 through the second electrode plate Cst2. For example, the first electrode of the driving transistor T5 and the second electrode plate Cst2 of the storage capacitor Cst are arranged at different layers, and the first electrode of the driving transistor T5 is coupled to the second electrode plate Cst2 through the third conductive pattern 66. The first electrode plate Cst1 of the storage capacitor Cst is multiplexed into the gate electrode of the driving transistor T5.

Exemplary, the second electrode plate Cst2 is also coupled to the second electrode of the third transistor T3 through the first conductive connection portion 60. The first electrode of the third transistor T3 is coupled to the initialization signal line 51 through the fifth conductive pattern 68.

Exemplary, the driving active layer 35 includes a U-shaped portion and two ends extending from both ends of the U-shaped portion. For example, the U-shaped portion is used to form the channel region of the driving transistor T5, and the two ends are respectively used as the first electrode and the second electrode of the driving transistor T5.

Exemplary, among the two sub-pixels adjacent in the first direction, the gate electrodes included in the two driving transistors T5 are symmetrically arranged about the first symmetry axis.

Exemplary, among the two sub-pixels adjacent in the second direction, the gate electrodes included in the two driving transistors T5 are symmetrically arranged about the second symmetry axis X2.

The symmetrical setting method effectively reduces the layout space occupied by sub-pixels, which is conducive to achieving high resolution of the display substrate.

As shown in FIGS. 4 to 7, and FIGS. 10 to 15, in some embodiments, the second transistor T2 includes a second active layer 32;

Among the two sub-pixels adjacent in the first direction, the two second active layers 32 included in the two second transistors T2 are arranged symmetrically about the first symmetry axis;

Among the two sub-pixels adjacent in the second direction, the two second active layers 32 included in the two second transistors T2 are arranged symmetrically about the second symmetry axis X2.

Exemplary, the second active layer 32 includes a portion extending in the first direction. For example, the width of the two ends of the second active layer 32 in the second direction is greater than the width of a middle portion between the two ends of the second active layer 32 in the second direction. For example, the orthographic projection of the middle portion of the second active layer 32 on the base substrate at least partially overlaps the orthographic projection of the gate electrode of the second transistor T2 on the base substrate, and the middle portion of the second active layer 32 is used to form the channel region of the second transistor T2.

The above setting method effectively reduces the layout space occupied by sub-pixels, which is conducive to the display substrate to achieve high display resolution.

As shown in FIGS. 4 to 7 and FIGS. 10 to 15, in some embodiments, the sub-pixel driving circuit also includes a first transistor T1, which includes a first active layer 31;

Among the two sub-pixels adjacent in the first direction, the first active layers 31 included in the two first transistors T1 is symmetrically arranged about the first symmetry axis;

Among the two sub-pixels adjacent in the second direction, the two first active layers 31 included in the two first transistors T1 are symmetrically arranged about the second symmetry axis X2.

Exemplary, the first active layer 31 includes a portion extending in the first direction. For example, the width of the two ends of the first active layer 31 in the second direction is greater than the width of the middle portion between the two ends of the first active layer 31 in the second direction. For example, the orthographic projection of the middle portion of the first active layer 31 on the base substrate at least partially overlaps the orthographic projection of the gate electrode of the first transistor T1 on the base substrate, and the middle portion of the first active layer 31 is used to form the channel region of the first transistor T1.

The above setting method effectively reduces the layout space occupied by sub-pixels, which is conducive to the display substrate to achieve high display resolution.

As shown in FIGS. 4 to 7 and FIGS. 10 to 15, in some embodiments, the sub-pixel driving circuit also includes a third transistor T3, the third transistor T3 includes a third active layer 33;

Among the two adjacent subpixels along the first direction, the two third active layers 33 included in the two third transistors T3 are symmetrically arranged about the first symmetry axis;

Among the two sub-pixels adjacent in the second direction, the two third active layers 33 included in the two third transistors T3 are symmetrically arranged about the second symmetry axis X2.

As shown in FIGS. 4 to 7 and FIGS. 10 to 15, in some embodiments, the sub-pixel driving circuit also includes a fourth transistor T4, the fourth transistor T4 includes a fourth active layer 34;

Among the two sub-pixels adjacent in the first direction, the two fourth active layers 34 included in the two fourth transistors T4 are symmetrically arranged about the first symmetry axis.

The above setting method effectively reduces the layout space occupied by sub-pixels, which is conducive to the display substrate to achieve high display resolution.

Figure 5:
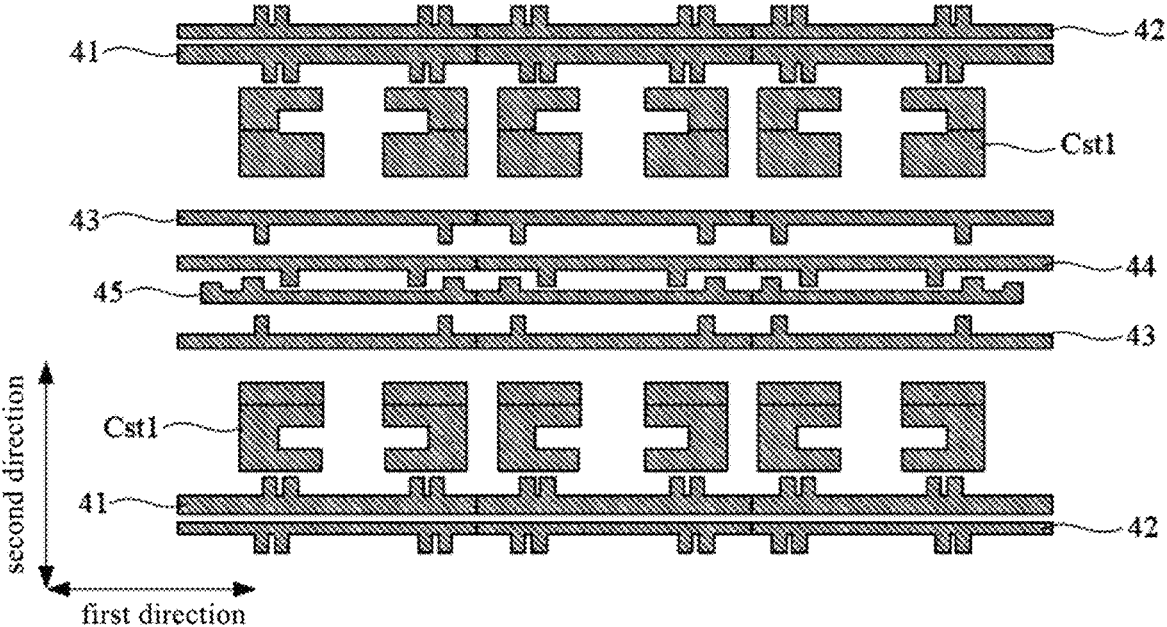
FIG. 5 is the layout diagram of the first gate metal layer in FIG. 3.
Figure 6:
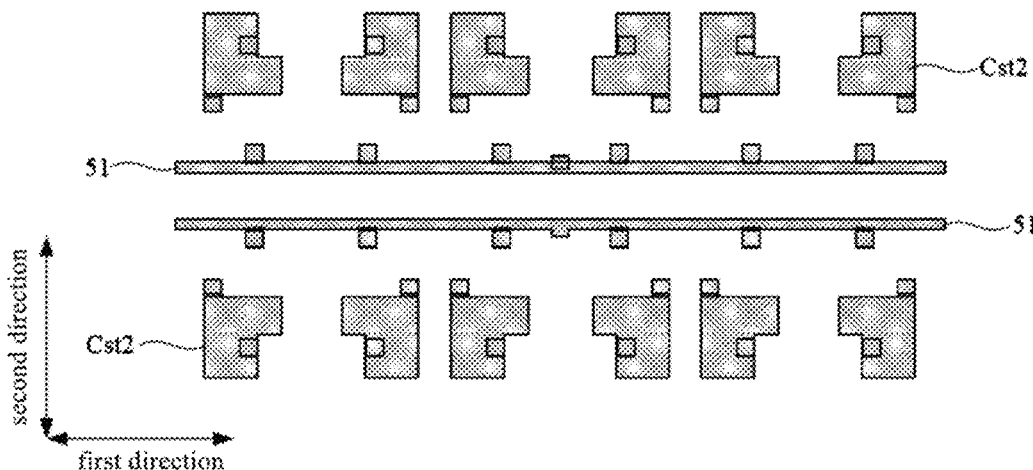
FIG. 6 is the layout diagram of the second gate metal layer in FIG. 3.
Figure 8:
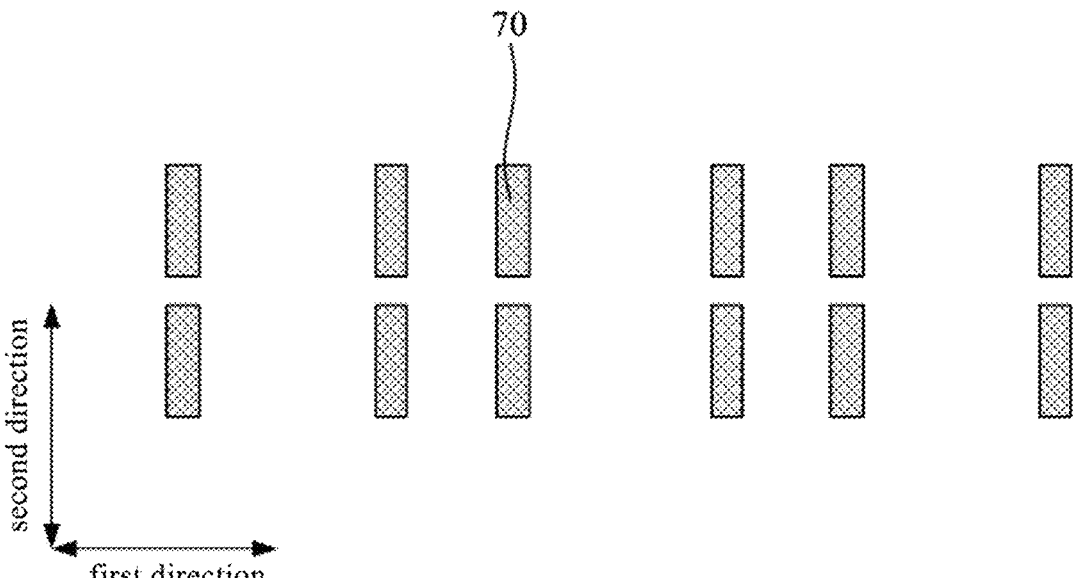
FIG. 8 is the layout diagram of the second source-drain metal layer in FIG. 3.
Figure 9:
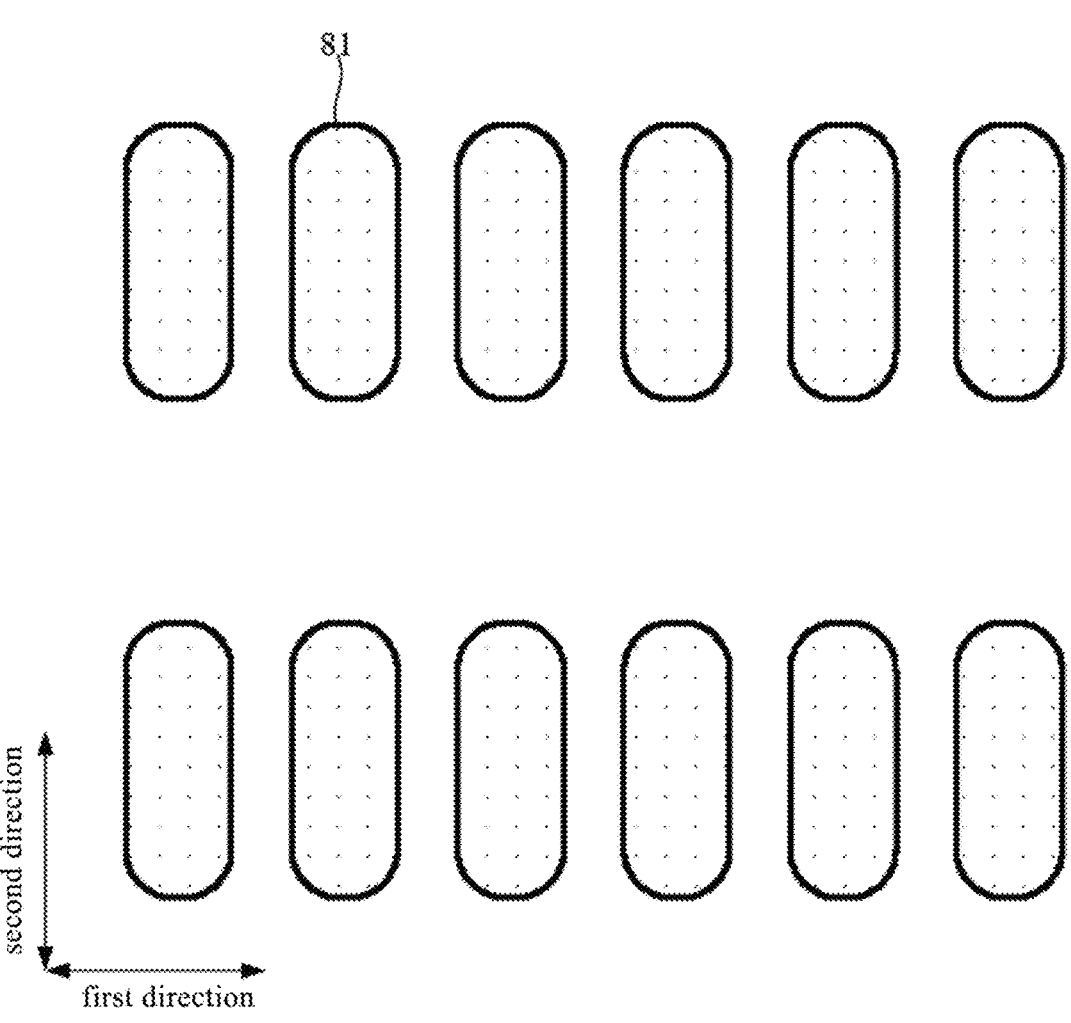
FIG. 9 is a layout diagram of the opening formed by the pixel defining layer in FIG. 3.
Figure 13:
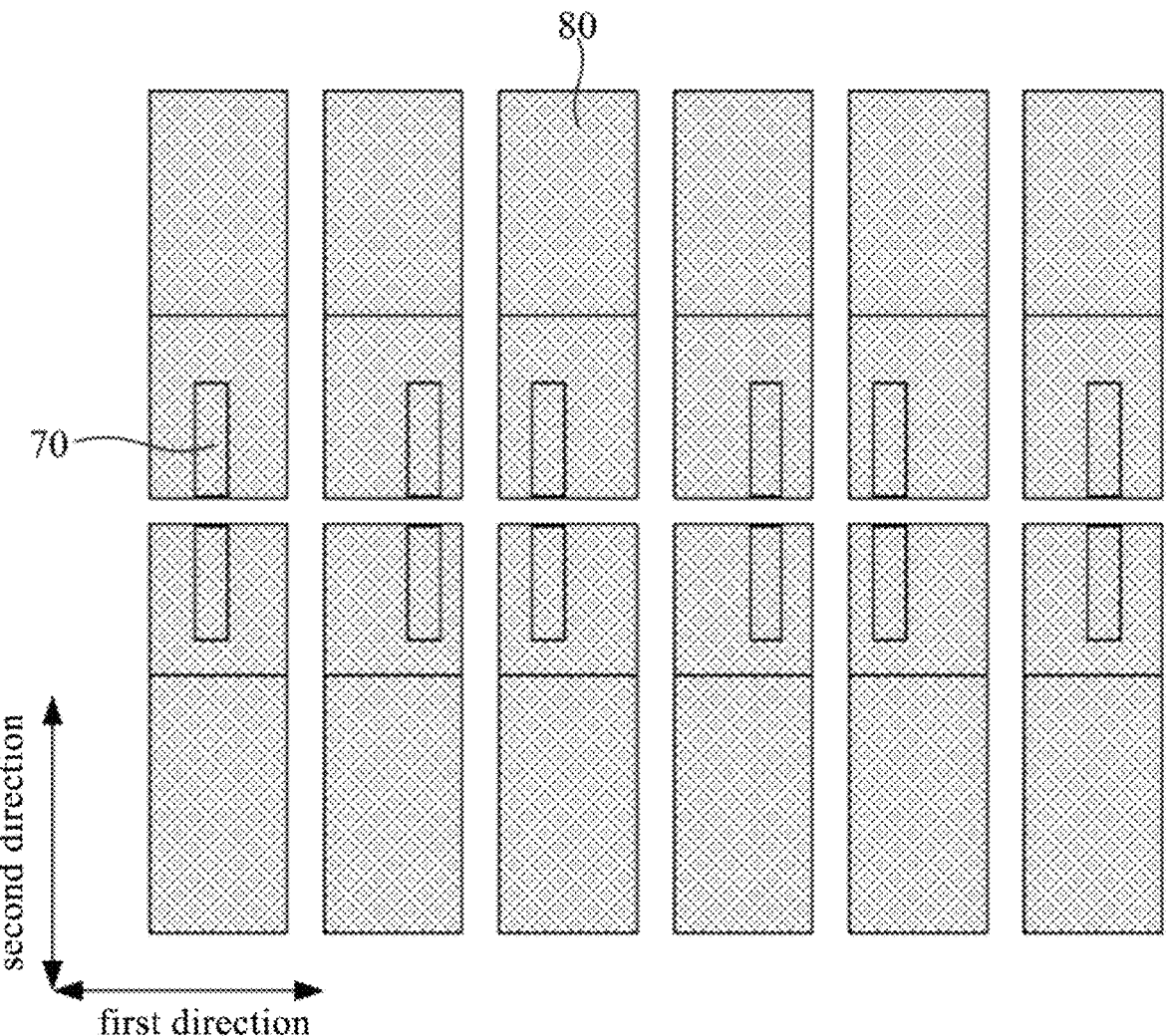
FIG. 13 is the layout diagram of the anode layer and the second source-drain metal layer provided by the embodiment of the present disclosure.

It should be noted that in the corresponding embodiments of FIGS. 16 to 22, the schematic diagram of the first gate metal layer is shown in FIG. 5, the schematic diagram of the second source-drain metal layer is shown in FIG. 8, the schematic diagram of the layout of the opening formed by the pixel definition layer is shown in FIG. 9, and the schematic diagram of the layout of the anode layer and the second source-drain metal layer is shown in FIG. 13.

Figure 18:
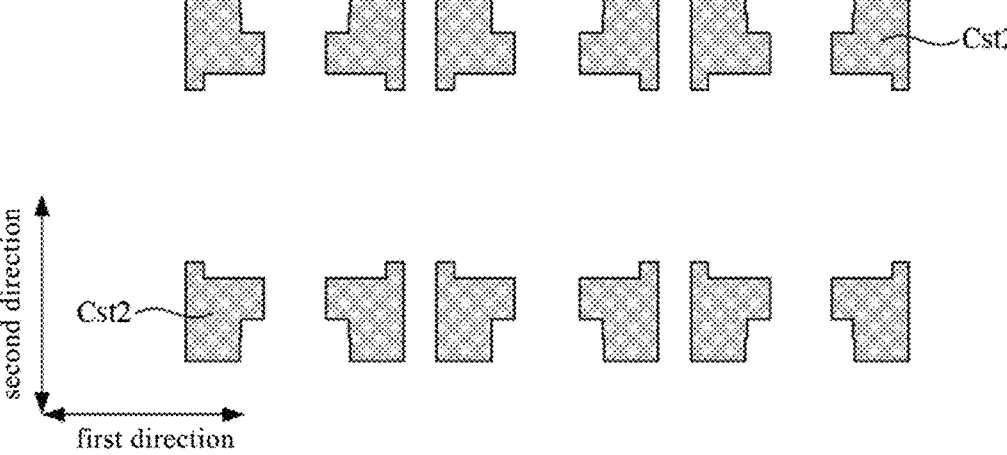
FIG. 18 is the layout diagram of the second gate metal layer in FIG. 16.
Figure 19:
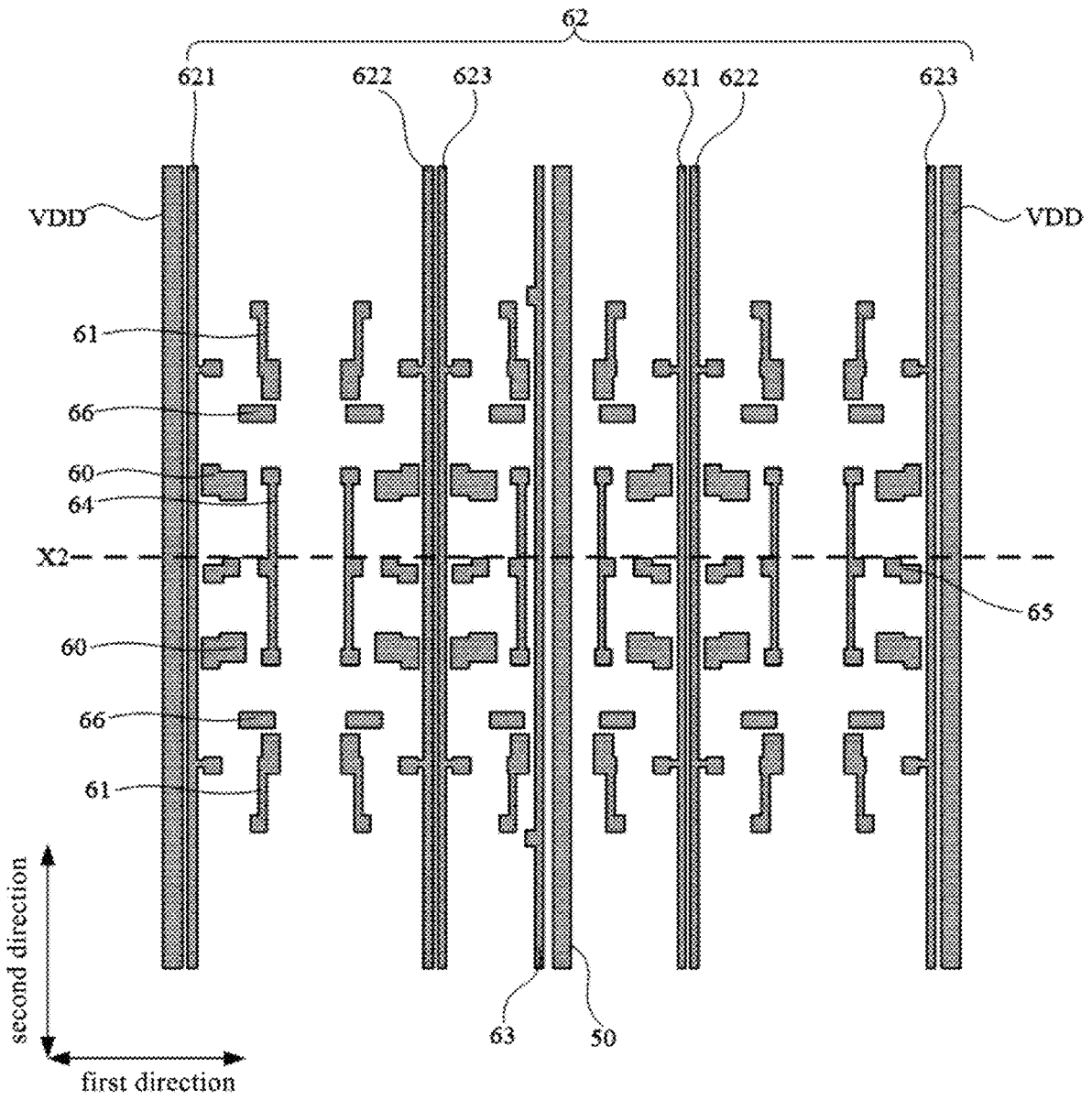
FIG. 19 is the layout diagram of the first source-drain metal layer in FIG. 16.
Figure 20:
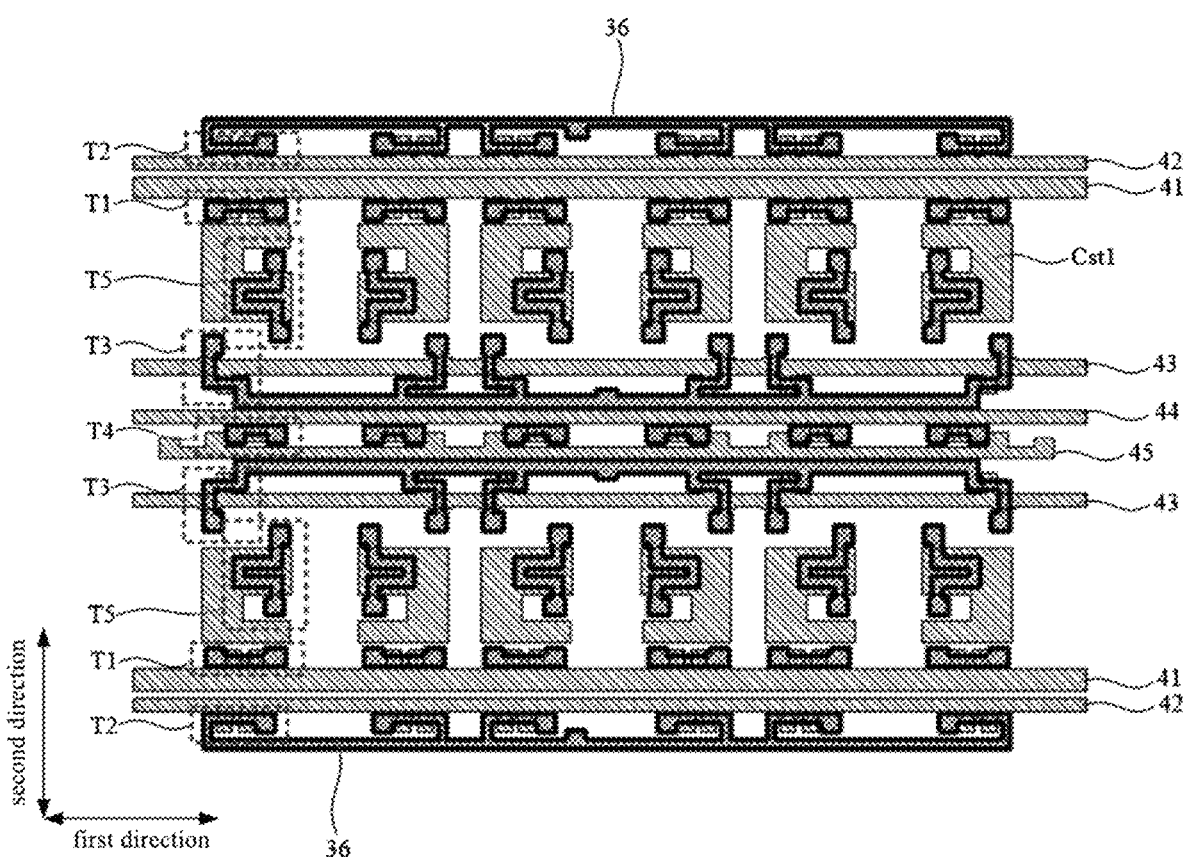
FIG. 20 is the layout diagram of the active layer and the first gate metal layer in FIG. 16.
Figure 21:
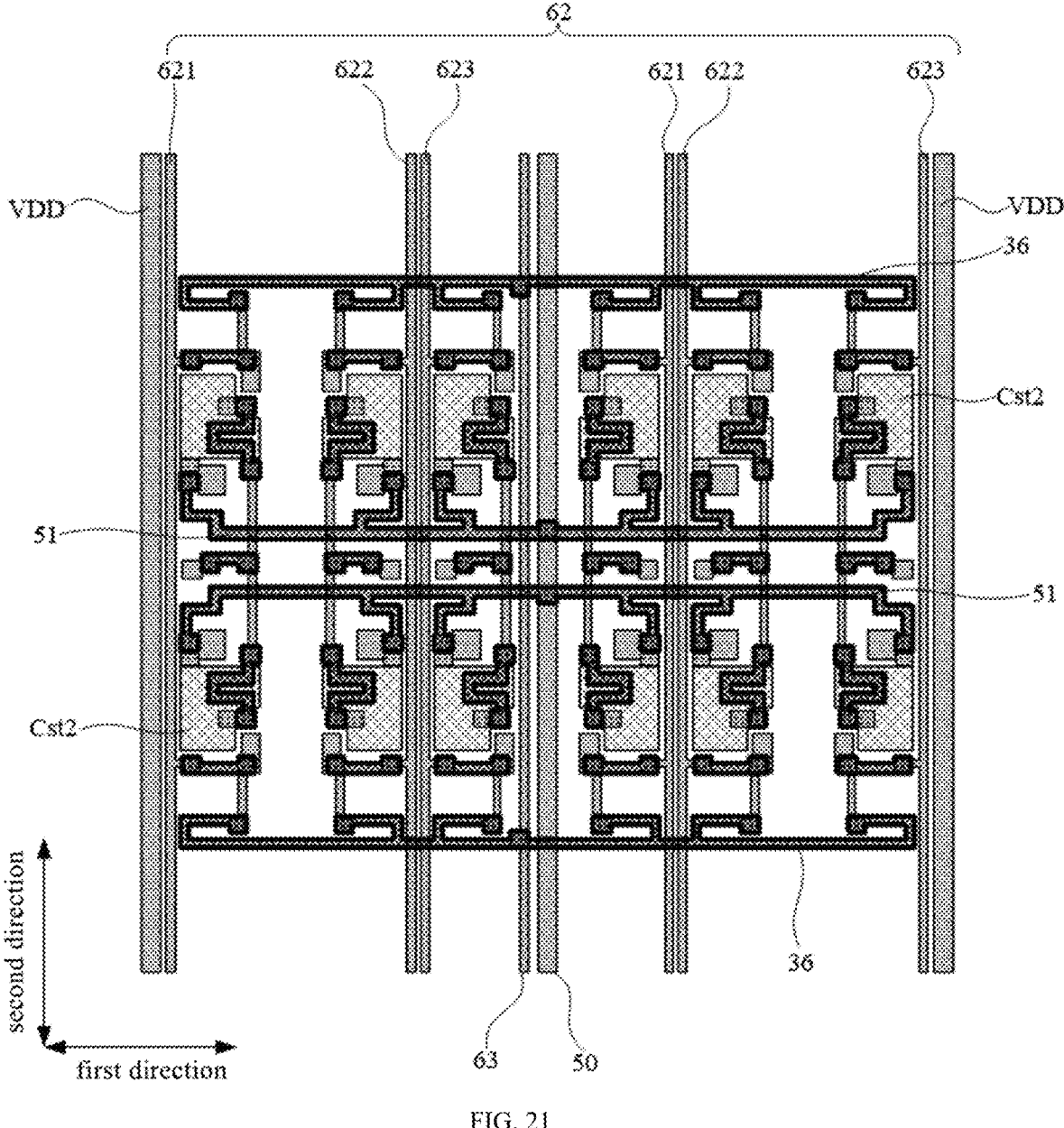
FIG. 21 is the layout diagram of the active layer, the second gate metal layer and the first source-drain metal layer in FIG. 16.
Figure 22:
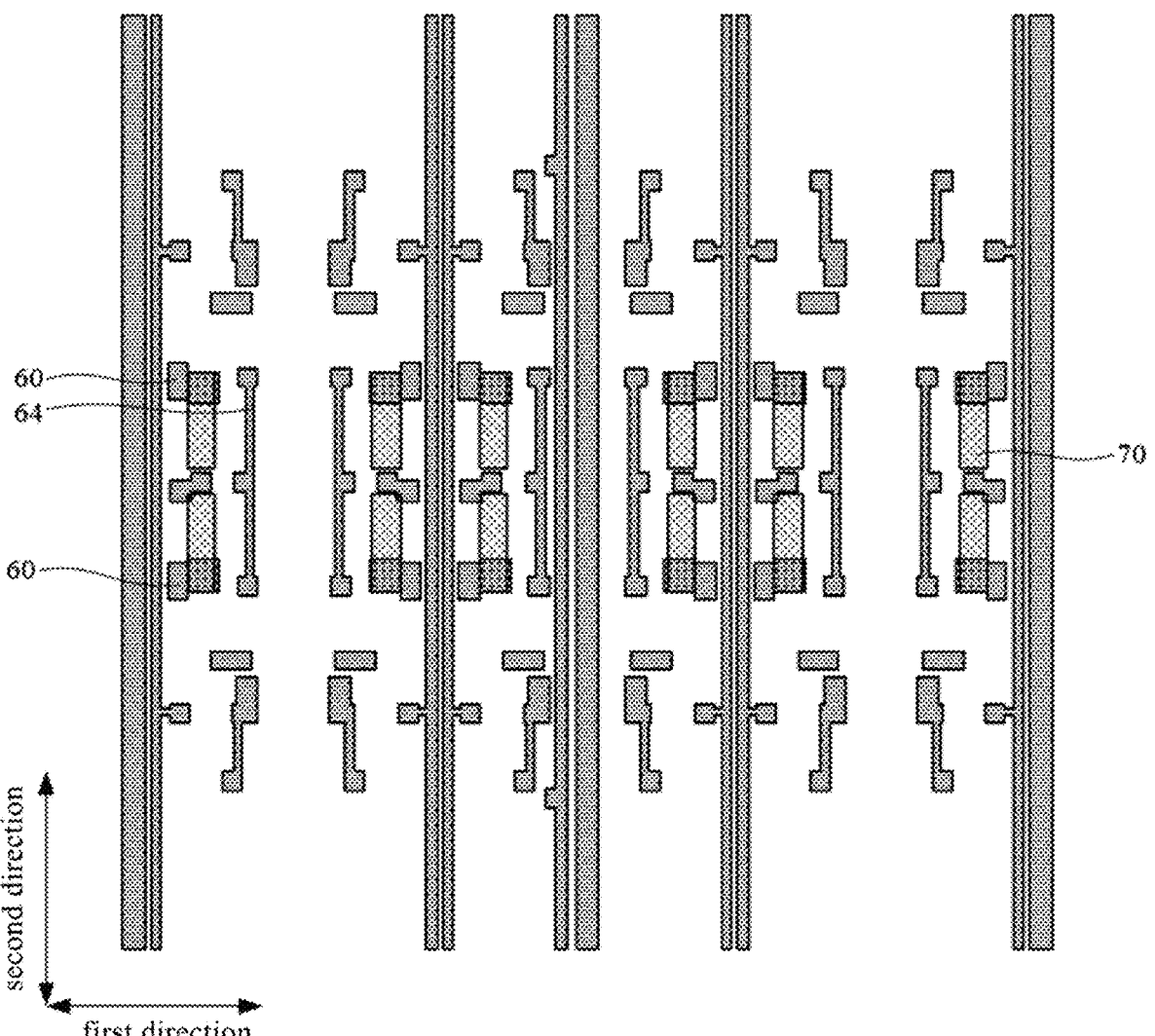
FIG. 22 is the layout diagram of the first source-drain metal layer and the second source-drain metal layer in FIG. 16.

In the corresponding embodiments of FIGS. 23 to 25, the schematic diagram of the first gate metal layer is shown in FIG. 5, the schematic diagram of the second gate metal layer is shown in FIG. 18, the schematic diagram of the first source-drain metal layer is shown in FIG. 19, the schematic diagram of the second source-drain metal layer is shown in FIG. 8, the schematic diagram of the opening formed by the pixel definition layer is shown in FIG. 9, and the schematic diagram of the anode layer and the second source-drain metal layer is shown in FIG. 13.

In the corresponding embodiments of FIGS. 26 to 28, the schematic diagram of the second gate metal layer is shown in FIG. 18, the schematic diagram of the first source-drain metal layer is shown in FIG. 19, the schematic diagram of the second source-drain metal layer is shown in FIG. 8, the schematic diagram of the opening formed by the pixel definition layer is shown in FIG. 9, and the schematic diagram of the anode layer and the second source-drain metal layer is shown in FIG. 13.

Figure 29:
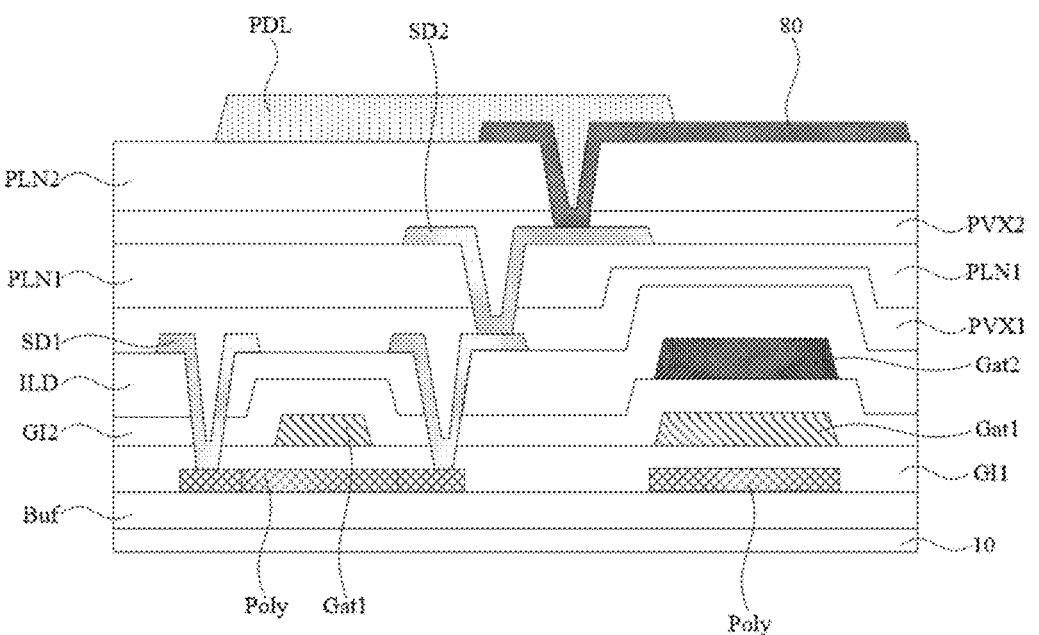
FIG. 29 is a partial sectional diagram of the display substrate provided by the embodiment of the present disclosure.

As shown in FIG. 29, for example, the display substrate includes a buffer layer Buf, an active layer Poly, a first gate insulating layer GIL a first gate metal layer Gat1, a second gate insulating layer GI2, a second gate metal layer Gat2, an interlayer insulating layer ILD, a first source-drain metal layer SD1, a first passivation layer PVX1, a first planarization layer PLN1, a second source-drain metal layer SD2, a second passivation layer PVX2, a second planarization layer PLN2, an anode layer (including the anode pattern 80), a pixel definition layer PDL, a light emitting function layer, a cathode layer, and a packaging structure which are sequentially stacked along the direction away from the base substrate. Exemplary, the display substrate may not include the first passivation layer PVX1 and/or the second passivation layer PVX2.

Exemplary, the display substrate is formed through 12 patterning processes (Mask process), specifically including: the patterning process of the active layer, the patterning process of the first gate metal layer, the patterning process of the second gate metal layer, the patterning process of the interlayer insulation layer, the patterning process of the first source-drain metal layer, the patterning process of the first planarization layer, the patterning process of the first passivation layer, the patterning process of the second source-drain metal layer, the patterning process of the second planarization layer, the patterning process of the second passivation layer, the patterning process of the anode layer and the patterning process of the pixel definition layer.

As shown in FIG. 9, the pixel definition layer forms the pixel opening 81. By way of example, the pixel opening 81 is an arc printing design with a same Pitch, which can improve the printing speed of forming organic light-emitting materials and the performance of the display substrate.

As shown in FIGS. 7 and 9, for example, among the two sub-pixels adjacent to each other along the second direction, two first conductive connection portions 60 are symmetrically arranged about the second symmetry axis X2, two first conductive patterns 64 are symmetrically arranged about the second symmetry axis X2, two third conductive patterns 66 are symmetrically arranged about the second symmetry axis X2, and two fifth conductive patterns 68 are symmetrically arranged about the second symmetry axis X2, two anode patterns are symmetrically arranged about the second symmetry axis X2, and the two pixel openings 81 are symmetrically arranged about the second symmetry axis X2, two first connection patterns 61 are symmetrically arranged about the second symmetry axis X2, two first electrode plates Cst1 are symmetrically arranged about the second symmetry axis X2, the two second electrode plates Cst2 are symmetrically arranged about the second symmetry axis X2, the two first active layers 31 are symmetrically arranged about the second symmetry axis X2, the two second active layers 32 are symmetrically arranged about the second symmetry axis X2, the two third active layers 33 are symmetrically arranged about the second symmetry axis X2, and the two fourth active layers 34 are symmetrically arranged about the second symmetry axis X2, two driving active layers 35 are symmetrically arranged about the second symmetry axis X2.

As shown in FIGS. 7 and 9, for example, among the two sub-pixels adjacent to each other along the first direction, two first conductive connection portions 60 are symmetrically arranged about the first symmetry axis, two first conductive patterns 64 are symmetrically arranged about the first symmetry axis, two second conductive patterns 65 are symmetrically arranged about the first symmetry axis, two third conductive patterns 66 are symmetrically arranged about the first symmetry axis, two fifth conductive patterns 68 are symmetrically arranged about the first symmetric axis, two anode patterns are symmetrically arranged about the first symmetric axis, two pixel openings 81 are symmetrically arranged about the first symmetric axis, two first electrode plates Cst1 are symmetrically arranged about the first symmetric axis, two second electrode plates Cst2 are symmetrically arranged about the first symmetric axis, and two first active layers 31 are symmetrically arranged about the first symmetric axis, two second active layers 32 are symmetrically arranged about the first symmetric axis, two third active layers 33 are symmetrically arranged about the first symmetric axis, two fourth active layers 34 are symmetrically arranged about the first symmetric axis, and two driving active layers 35 are symmetrically arranged about the first symmetric axis, two first connection patterns 61 are symmetrically arranged about the first symmetry axis.

As shown in FIG. 7, FIG. 8, FIG. 12 and FIG. 13, in some embodiments, the sub-pixel also includes a first conductive connection portion 60 and a second conductive connection portion 70 arranged in different layers, the first conductive connection portion 60 is located between the base substrate and the second conductive connection portion 70, and the anode pattern 80 is located on the side of the second conductive connection portion 70 away from the base substrate;

The second electrode plate Cst2 is coupled to the first conductive connection portion 60;

There is a first overlapping area between the orthographic projection of the second conductive connection portion 70 on the base substrate 10 and the orthographic projection of the first conductive connection portion 60 on the base substrate 10, there is a second overlapping area between the orthographic projection of the second conductive connection portion 70 on the base substrate 10 and the orthographic projection of the anode pattern 80 on the base substrate 10;

The second conductive connection portion 70 is coupled to the first conductive connection portion 60 through a first via hole, and the orthographic projection of the first via hole on the base substrate 10 is located in the first overlapping area; the second conductive connection portion 70 is coupled to the anode pattern 80 through the second via hole, and the orthographic projection of the second via hole on the base substrate 10 is located in the second overlapping area.

Figure 2:
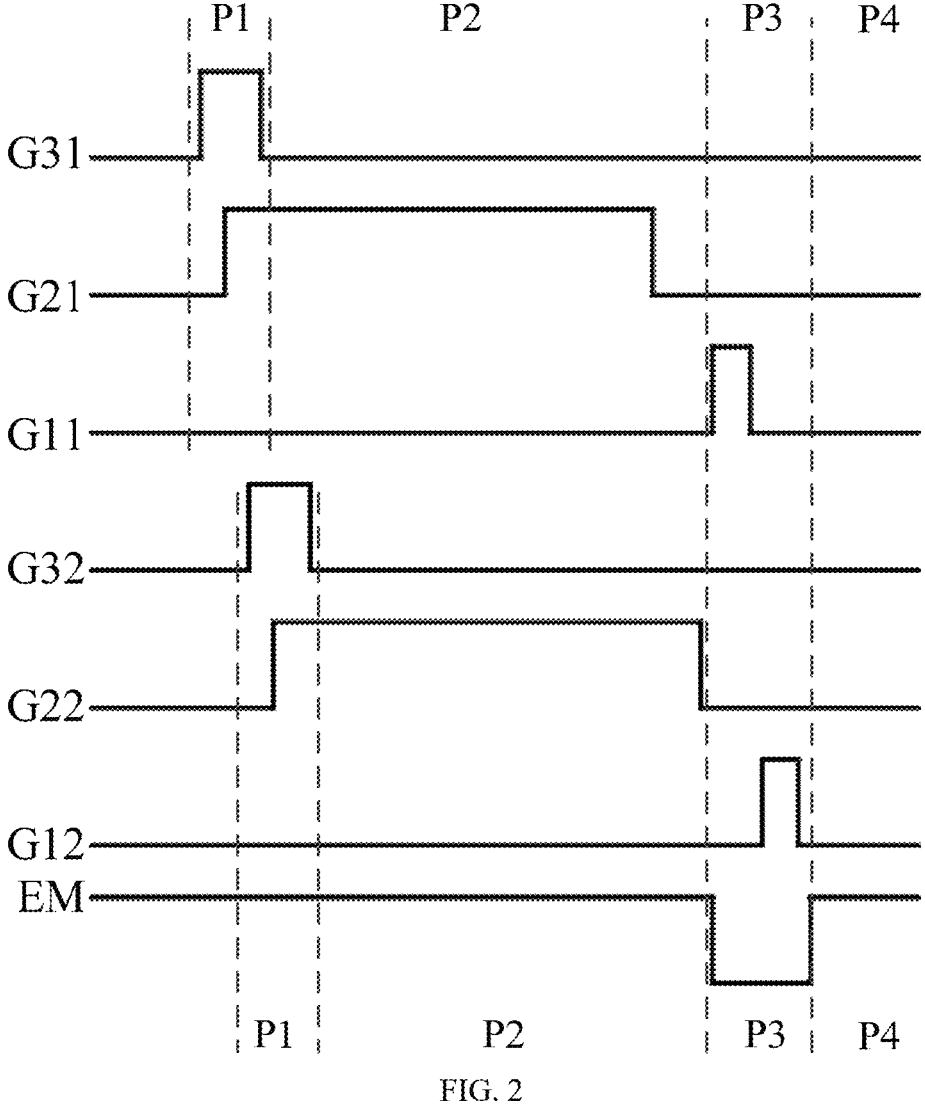
FIG. 2 is a driving timing diagram of two adjacent sub-pixel driving circuits along the second direction provided by the embodiment of the present disclosure.
Figure 3:
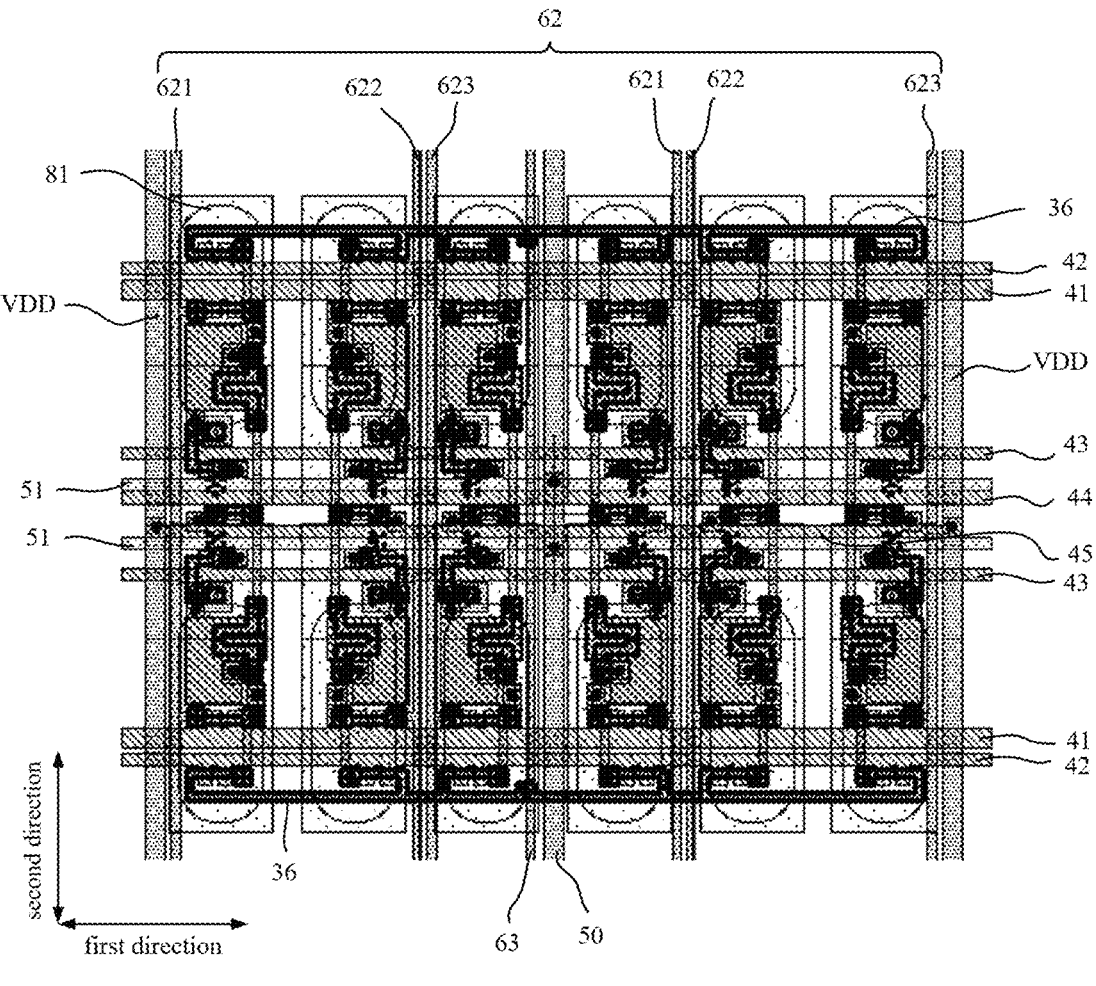
FIG. 3 is a first layout diagram corresponding to the circuit diagram in FIG. 1.
Figure 4:
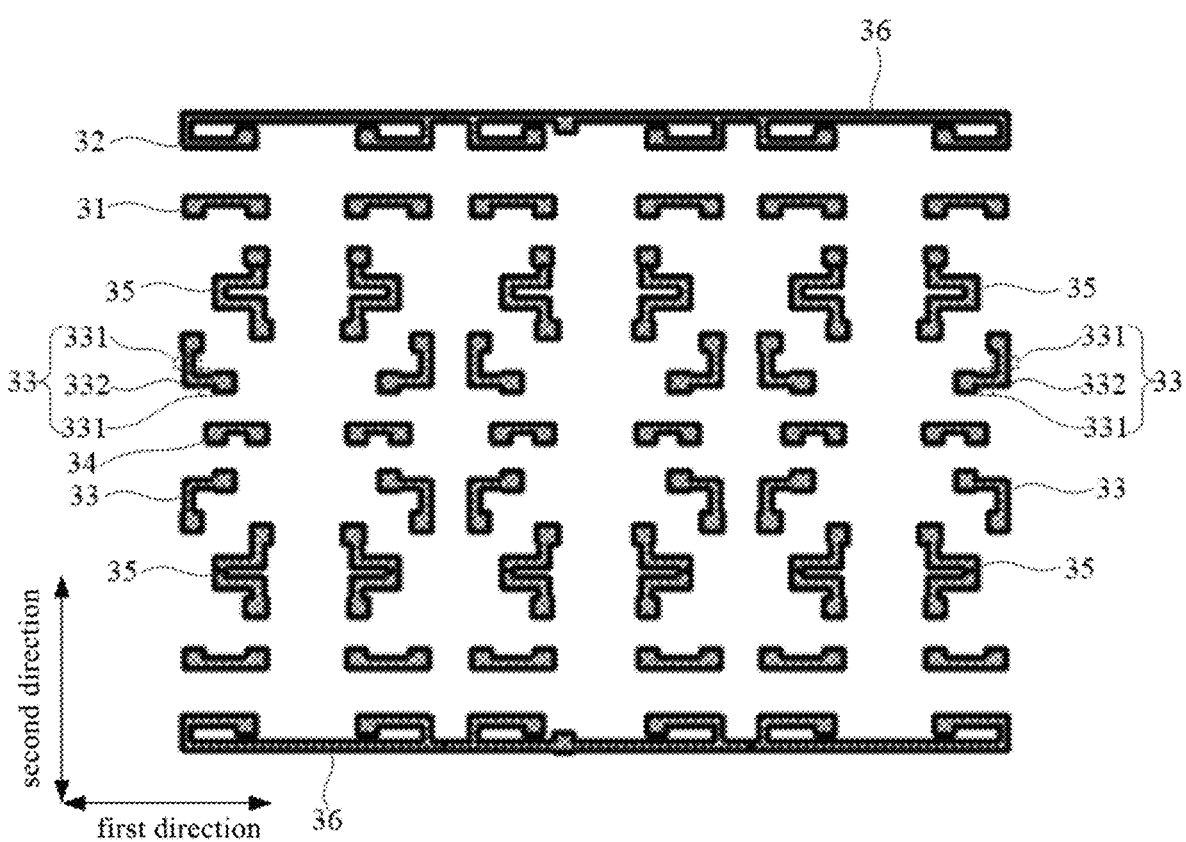
FIG. 4 is a schematic diagram of the active layer in FIG. 3.

As shown in FIG. 1 and FIG. 2, in the display substrate provided by the above embodiment, the sub-pixel driving circuit includes the driving transistor T5, the fourth transistor T4, the first transistor T1, the second transistor T2, the third transistor T3 and the storage capacitor Cst.

Among the two sub-pixels adjacent to each other along the second direction, the working process of each of the sub-pixel located in the first row and the sub-pixel located in the second row includes: a reset period P1, a compensation period P2, a data writing-in period P3 and a light emitting period P4.

The reset periods of the sub-pixel located in the first row and the sub-pixel located in the second row are staggered, the compensation periods of the sub-pixel located in the first row and the sub-pixel located in the second row are partially staggered, and the data writing-in periods of the sub-pixel located in the first row and the sub-pixel located in the second row are completely staggered.

It should be noted that during the data writing-in period of the sub-pixel located in the first row and the sub-pixel located in the second row, the light emitting control signal EM is at an inactive level, which can avoid that the first electrode of the driving transistor T5 of the first row of sub-pixel continuously receives the power signal Vd during the data writing-in process of the second sub-pixel, avoiding the drop of the gate-source voltage of the driving transistor T5 of the sub-pixel located in the first row, affecting the compensation effect on the sub-pixel driving circuit of the first sub-pixel.

FIG. 1 shows the light-emitting element EL, the negative power supply signal VSS provided by the cathode layer, the reference signal Vref provided by the reference signal line 63, the initialization signal Vinit provided by the initialization signal bus 50, the power signal Vd provided by the power line VDD, the light emitting control signal EM provided by the light emitting control line 44.

FIG. 2 shows the first scan signal G11 inputted by the first scan line 41, the second scan signal G21 inputted by the second scan line 42, and the third scan signal G31 inputted by the third scan line 43 in the first row of sub-pixels. FIG. 2 also shows the first scan signal G12 inputted by the first scan line 41, the second scan signal G22 inputted by the second scan line 42, and the third scan signal G32 inputted by the third scan line 43 in the second row of sub-pixels.

The embodiment of the present disclosure also provides a display device, including a display substrate provided by the above embodiment.

In the display substrate provided by the above embodiment, the first electrode of the second transistor T2 and the reference signal line 36 are arranged to form an integrated structure, which can reduce the distance between the first electrode of the second transistor T2 and the reference signal line 36, reduce the layout space occupied by the sub-pixel, and reduce the layout difficulty of the sub-pixel. Moreover, it is not necessary to set other switching patterns to electrically connect the first electrode of the second transistor T2 and the reference signal line 36, further reduce the layout difficulty of the display substrate.

In addition, in the display substrate provided by the above embodiment, the first electrode of the second transistor T2 and the reference signal line 36 are arranged to form an integrated structure, so that the first electrode of the second transistor T2 and the reference signal line 36 can be formed simultaneously in the same process, and the coupling is realized, which not only simplifies the production process of the display substrate, but also reduces the production cost, better ensures the connection performance of the first electrode of the second transistor T2 and the reference signal line 36, and improves the production yield of the display substrate.

When the display device provided by the embodiment of the present disclosure includes the display substrate, it also has the above beneficial effects, which will not be repeated here.

It should be noted that the display device can be any product or component with display function, such as TV, display, digital photo frame, mobile phone, tablet computer, etc., wherein the display device also includes flexible circuit board, printed circuit board, backplane, etc.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include multiple exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a base substrate, a plurality of sub-pixels arranged on the base substrate, wherein the plurality of sub-pixels is arranged in an array; the sub-pixel includes:

a reference signal line and a second scan line; and, a sub-pixel driving circuit including a driving transistor and a second transistor, a gate electrode of the second transistor being coupled to the second scan line, a first electrode of the second transistor and the reference signal line forming an integrated structure, a second electrode of the second transistor being coupled to a gate electrode of the driving transistor, wherein the second transistor includes a second active layer, the second active layer forms the first electrode and second electrode of the second transistor, and at least part of the reference signal line extends along a first direction; at least part of the second active layer extends along the first direction; at least part of the second scan line extends along the first direction; at least part of an orthographic projection of the second active layer on the base substrate is located between an orthographic projection of the reference signal line on the base substrate and an orthographic projection of the second scan line on the base substrate.

2. The display substrate according to claim 1, wherein the sub-pixel further includes a first scan line, a data line, and a first connection pattern; the sub-pixel driving circuit further includes a first transistor;

a gate electrode of the first transistor is coupled to the first scan line, a first electrode of the first transistor is coupled to the data line, and a second electrode of the first transistor is coupled to the gate electrode of the driving transistor;

the first connection pattern is respectively coupled to the second electrode of the first transistor and the second electrode of the second transistor, an orthographic projection of the first connection pattern on the base substrate overlaps an orthographic projection of the first scan line on the base substrate and an orthographic projection of the second scan line on the base substrate, respectively.

3. The display substrate according to claim 1, wherein the plurality of sub-pixels is divided into a plurality of repeating units, and the plurality of repeating units is divided into a plurality of columns of repeating units; the display substrate further includes a plurality of power lines, and the plurality of power lines and the plurality of columns of repeating units are alternately arranged along the first direction, and the plurality of power lines extend along the second direction;

in each repeating unit, the reference signal lines located in sub-pixels of a same row along the first direction form an integrated structure; an orthographic projection of the reference signal line on the base substrate does not overlap an orthographic projection of the power line on the base substrate.

4. The display substrate according to claim 3, wherein the sub-pixel further includes a third scan line and an initialization signal line;

the sub-pixel driving circuit further includes a third transistor, a gate electrode of the third transistor is coupled to the third scan line, a first electrode of the third transistor and the initialization signal line form a second integrated structure, and a second electrode of the third transistor is coupled to a first electrode of the driving transistor.

5. The display substrate according to claim 4, wherein, in each repeating unit, initialization signal lines located in the sub-pixels of the same row along the first direction form an integrated structure; an orthographic projection of the initialization signal line on the base substrate does not overlap the orthographic projection of the power line on the base substrate.

6. The display substrate according to claim 5, wherein the repeating unit includes an initialization signal bus, at least part of the initialization signal bus extends along a second direction, and the second direction intersects the first direction; the initialization signal bus is coupled to the initialization signal line.

7. The display substrate according to claim 4, wherein the third transistor is of a double gate structure, the third transistor includes a third active layer, the third active layer includes two third channel portions, and a conductor portion respectively coupled to the two third channel portions;

the repeating unit includes a plurality of second connection patterns, in the repeating unit, along the first direction, first electrodes of adjacent third transistors are coupled through the second connection pattern, or conductor portions of the adjacent third transistors are coupled through the second connection pattern; an orthographic projection of the second connection pattern on the base substrate is located between orthographic projections of part of gate electrodes of two adjacent third transistors coupled to the second connection pattern on the base substrate;

the repeating unit further includes an initialization signal bus, the initialization signal bus extends along a second direction, the second direction intersects the first direction, and the initialization signal bus is coupled to the second connection pattern.

8. The display substrate according to claim 7, wherein the first electrode of the conductor portion of the third transistor coupled to the second connection pattern and the second connection pattern form a third integrated structure.

9. The display substrate according to claim 4, wherein the third active layer is of a U-shaped structure, and there are two overlapping areas between an orthographic projection of the third active layer on the base substrate and an orthographic projection of the third scan line on the base substrate; two ends of the third active layer at the U-shaped opening are respectively coupled to the initialization signal line; a part of the third active layer at a bottom of the U-shape is coupled to the first electrode of the driving transistor.

10. The display substrate according to claim 3, wherein the sub-pixel further includes a light-emitting control line;

the sub-pixel driving circuit further includes a fourth transistor, a gate electrode of the fourth transistor is coupled to the light-emitting control line, an electrode of the fourth transistor is coupled to the power line, and a second electrode of the fourth transistor is coupled to a second electrode of the driving transistor;

in a same repeating unit, a same fourth transistor is shared by adjacent sub-pixel driving circuits along the second direction, and the same light-emitting control signal line is shared by the adjacent sub-pixel driving circuits along the second direction.

11. The display substrate according to claim 10, wherein the sub-pixel includes an anode pattern;

the fourth transistor includes a fourth active layer, an orthographic projection of the fourth active layer on the base substrate is located between orthographic projections of two adjacent anode patterns along the second direction on the base substrate.

12. The display substrate according to claim 1, wherein the driving transistor includes a driving active layer;

among two adjacent subpixels along the first direction, two driving active layers included in two driving transistors are symmetrically arranged about a first symmetry axis, the first symmetry axis extends along the second direction, and an orthographic projection of the first symmetry axis on the base substrate is located between orthographic projections of two anode patterns included in the two adjacent subpixels along the first direction on the base substrate;

among two adjacent sub-pixels along the second direction, two driving active layers included in two driving transistors are symmetrically arranged about a second symmetry axis, the second symmetry axis extends along the first direction, an orthographic projection of the second symmetry axis on the base substrate is located between orthographic projections of two anode patterns included in the two adjacent sub-pixels along the second direction on the base substrate.

13. The display substrate according to claim 12, wherein the second transistor includes a second active layer;

among two adjacent sub-pixels along the first direction, two second active layers included in two second transistors are arranged symmetrically about the first symmetry axis;

among two adjacent sub-pixels along the second direction, two second active layers included in two second transistors are arranged symmetrically about the second symmetry axis.

14. The display substrate according to claim 12, wherein the sub-pixel driving circuit further includes a first transistor, the first transistor includes a first active layer;

among two adjacent sub-pixels along the first direction, two first active layers included in two first transistors is symmetrically arranged about the first symmetry axis;

among two adjacent sub-pixels along the second direction, two first active layers included in two first transistors are symmetrically arranged about the second symmetry axis.

15. The display substrate according to claim 12, wherein the sub-pixel driving circuit further includes a third transistor, the third transistor includes a third active layer;

among two adjacent subpixels along the first direction, two third active layers included in two third transistors are symmetrically arranged about the first symmetry axis;

among two adjacent sub-pixels along the second direction, two third active layers included in two third transistors are symmetrically arranged about the second symmetry axis.

16. The display substrate according to claim 12, wherein the sub-pixel driving circuit also includes a fourth transistor, the fourth transistor includes a fourth active layer;

among two adjacent sub-pixels along the first direction, two fourth active layers included in two fourth transistors are symmetrically arranged about the first symmetry axis.

17. A display device comprising the display substrate according to claim 1.

18. The display device according to claim 17, wherein the sub-pixel further includes a first scan line, a data line, and a first connection pattern; the sub-pixel driving circuit further includes a first transistor;

a gate electrode of the first transistor is coupled to the first scan line, a first electrode of the first transistor is coupled to the data line, and a second electrode of the first transistor is coupled to the gate electrode of the driving transistor;

the first connection pattern is respectively coupled to the second electrode of the first transistor and the second electrode of the second transistor, an orthographic projection of the first connection pattern on the base substrate overlaps an orthographic projection of the first scan line on the base substrate and an orthographic projection of the second scan line on the base substrate, respectively.

* * * * *